(12) United States Patent
Parker et al.

(10) Patent No.: US 10,042,553 B2
(45) Date of Patent: Aug. 7, 2018

(54) METHOD AND SYSTEM FOR PROGRAMMING A MULTI-LAYER NON-VOLATILE MEMORY HAVING A SINGLE FOLD DATA PATH

(71) Applicant: SanDisk Technologies Inc., Plano, TX (US)

(72) Inventors: Liam Michael Parker, Edinburgh (GB); Alan David Bennett, Edinburgh (GB); Alan Welsh Sinclair, Falkirk (GB); Sergey Anatolievich Gorobets, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 155 days.

(21) Appl. No.: 14/928,582

(22) Filed: Oct. 30, 2015

(65) Prior Publication Data

US 2017/0123664 A1    May 4, 2017

(51) Int. Cl.
*G06F 3/06* (2006.01)

(52) U.S. Cl.
CPC ............ *G06F 3/0604* (2013.01); *G06F 3/064* (2013.01); *G06F 3/0608* (2013.01);
(Continued)

(58) Field of Classification Search
CPC .... G06F 3/0604; G06F 3/0608; G06F 3/0611; G06F 3/064; G06F 3/0647; G06F 3/0688
See application file for complete search history.

(56) References Cited

U.S. PATENT DOCUMENTS 5,535,369 A    7/1996    Wells et al.
5,570,315 A    10/1996   Tanaka et al.
(Continued)

FOREIGN PATENT DOCUMENTS

EP    1143455 A2    10/2001
EP    1389755 A2    2/2004
(Continued)

OTHER PUBLICATIONS

Office Action for related U.S. Appl. No. 14/928,649 dated May 3, 2017.
(Continued)

*Primary Examiner* — Yaima Rigol
(74) *Attorney, Agent, or Firm* — Brinks Gilson & Lione

(57) ABSTRACT

A method is disclosed for only permitting data from a host to be written to a first non-volatile memory layer and only permitting data to be written into a second non-volatile memory layer via a maintenance operation over a single data path between the layers. The single data path may be an on-chip copy data path. A memory system includes a multi-layer non-volatile memory and data management circuitry, where the data management circuitry includes data flow path circuitry defining only a single data path for programming any data into the second layer. Maintenance manager circuitry and programming interleave circuitry in the data management circuitry are configured to select a maintenance schedule, and to interleave programming of host data with maintenance operation writes for the selected maintenance schedule only along the one or more data paths defined by the data flow path circuitry.

17 Claims, 24 Drawing Sheets

(52) U.S. Cl.
CPC .......... *G06F 3/0611* (2013.01); *G06F 3/0647* (2013.01); *G06F 3/0688* (2013.01)

(56) References Cited

U.S. PATENT DOCUMENTS

| | | | |
|---|---|---|---|
| 5,630,093 A | 5/1997 | Holzhammer et al. |
| 5,696,917 A | 12/1997 | Mills et al. |
| 5,774,397 A | 6/1998 | Endoh et al. |
| 5,860,124 A | 1/1999 | Matthews et al. |
| 5,869,845 A | 2/1999 | Vander Wagt et al. |
| 5,930,167 A | 7/1999 | Lee et al. |
| 5,960,169 A | 9/1999 | Styczinski |
| 6,026,465 A | 2/2000 | Mills et al. |
| 6,046,935 A | 4/2000 | Takeuchi et al. |
| 6,069,827 A | 5/2000 | Sinclair |
| 6,373,746 B1 | 4/2002 | Takeuchi et al. |
| 6,456,528 B1 | 9/2002 | Chen |
| 6,522,580 B2 | 2/2003 | Chen et al. |
| 6,622,199 B1 | 9/2003 | Spall et al. |
| 6,715,027 B2 | 3/2004 | Kim et al. |
| 6,725,321 B1 | 4/2004 | Sinclair et al. |
| 6,771,536 B2 | 8/2004 | Li et al. |
| 6,781,877 B2 | 8/2004 | Cernea et al. |
| 7,154,781 B2 | 12/2006 | Lakhani et al. |
| 7,336,531 B2 | 2/2008 | Roohparvar |
| 7,409,489 B2 | 8/2008 | Sinclair |
| 7,420,867 B2 | 9/2008 | Brox |
| 7,433,993 B2 | 10/2008 | Sinclair |
| 7,444,462 B2 | 10/2008 | Traister et al. |
| 7,552,280 B1 | 6/2009 | Naamad et al. |
| 7,865,658 B2 | 1/2011 | Lasser et al. |
| 7,903,459 B2 | 3/2011 | Yu et al. |
| 7,930,468 B2 | 4/2011 | Caulkins |
| 7,984,084 B2 | 7/2011 | Sinclair |
| 7,996,642 B1 | 8/2011 | Smith |
| 8,095,735 B2 | 1/2012 | Brewer et al. |
| 8,209,503 B1 | 6/2012 | Smith |
| 8,228,728 B1 | 7/2012 | Yang et al. |
| 8,239,617 B1 | 8/2012 | Linnell |
| 8,412,752 B2 | 4/2013 | Dodge |
| 8,429,352 B2 | 4/2013 | Sinclair |
| 8,473,669 B2 | 6/2013 | Sinclair |
| 8,537,613 B2 | 9/2013 | Sinclair et al. |
| 8,677,037 B1 | 3/2014 | Karamcheti et al. |
| 8,689,042 B1 | 4/2014 | Kanapathippillai et al. |
| 8,706,932 B1 | 4/2014 | Kanapathippillai et al. |
| 8,850,091 B1 | 9/2014 | Karamcheti et al. |
| 8,873,284 B2 | 10/2014 | Sinclair et al. |
| 9,223,693 B2 | 12/2015 | Sinclair et al. |
| 2002/0172081 A1 | 11/2002 | Mukaida et al. |
| 2003/0109093 A1 | 6/2003 | Harari et al. |
| 2003/0147278 A1 | 8/2003 | Tanaka et al. |
| 2003/0229753 A1 | 12/2003 | Hwang |
| 2004/0030847 A1 | 2/2004 | Tremaine |
| 2004/0073748 A1 | 4/2004 | Rudelic |
| 2004/0260957 A1 | 12/2004 | Jeddeloh et al. |
| 2005/0144361 A1 | 6/2005 | Gonzalez et al. |
| 2005/0144363 A1 | 6/2005 | Sinclair |
| 2005/0195635 A1 | 9/2005 | Conley et al. |
| 2005/0278479 A1 | 12/2005 | Wu et al. |
| 2006/0020744 A1 | 1/2006 | Sinclair et al. |
| 2006/0031593 A1 | 2/2006 | Sinclair |
| 2006/0047800 A1 | 3/2006 | Caveney et al. |
| 2006/0149891 A1 | 7/2006 | Rudelic |
| 2006/0161724 A1 | 7/2006 | Bennett et al. |
| 2006/0161728 A1 | 7/2006 | Bennett et al. |
| 2006/0184718 A1 | 8/2006 | Sinclair et al. |
| 2006/0184719 A1 | 8/2006 | Sinclair |
| 2006/0184720 A1 | 8/2006 | Sinclair et al. |
| 2006/0184722 A1 | 8/2006 | Sinclair |
| 2006/0184723 A1 | 8/2006 | Sinclair et al. |
| 2006/0285397 A1 | 12/2006 | Nishihara et al. |
| 2007/0016756 A1 | 1/2007 | Hsieh et al. |
| 2007/0030734 A1 | 2/2007 | Sinclair et al. |
| 2007/0033323 A1 | 2/2007 | Gorobets |
| 2007/0033324 A1 | 2/2007 | Sinclair |
| 2007/0033325 A1 | 2/2007 | Sinclair |
| 2007/0033329 A1 | 2/2007 | Sinclair et al. |
| 2007/0033330 A1 | 2/2007 | Sinclair et al. |
| 2007/0033376 A1 | 2/2007 | Sinclair et al. |
| 2007/0033378 A1 | 2/2007 | Sinclair et al. |
| 2007/0101096 A1 | 5/2007 | Gorobets |
| 2007/0136555 A1 | 6/2007 | Sinclair |
| 2007/0156998 A1 | 7/2007 | Gorobets |
| 2007/0186032 A1 | 8/2007 | Sinclair et al. |
| 2007/0186065 A1 | 8/2007 | Lee et al. |
| 2007/0239928 A1 | 10/2007 | Gera et al. |
| 2008/0034154 A1 | 2/2008 | Lee et al. |
| 2008/0067573 A1 | 3/2008 | Jang et al. |
| 2008/0084739 A1 | 4/2008 | Chae et al. |
| 2008/0094952 A1 | 4/2008 | Brondijk et al. |
| 2008/0155175 A1 | 6/2008 | Sinclair et al. |
| 2008/0155176 A1 | 6/2008 | Sinclair et al. |
| 2008/0155177 A1 | 6/2008 | Sinclair et al. |
| 2008/0155178 A1 | 6/2008 | Sinclair et al. |
| 2008/0155227 A1 | 6/2008 | Sinclair et al. |
| 2008/0155228 A1 | 6/2008 | Sinclair et al. |
| 2008/0307158 A1 | 12/2008 | Sinclair |
| 2008/0307164 A1 | 12/2008 | Sinclair |
| 2008/0307192 A1 | 12/2008 | Sinclair et al. |
| 2008/0316815 A1 | 12/2008 | Lin |
| 2008/0320209 A1 | 12/2008 | Lee et al. |
| 2009/0132758 A1 | 5/2009 | Jiang et al. |
| 2009/0157994 A1 | 6/2009 | Hampel et al. |
| 2009/0164745 A1 | 6/2009 | Sinclair et al. |
| 2009/0172258 A1 | 7/2009 | Olbrich et al. |
| 2009/0172263 A1 | 7/2009 | Olbrich et al. |
| 2009/0182791 A1 | 7/2009 | Gorobets |
| 2009/0196102 A1 | 8/2009 | Kim |
| 2009/0210614 A1 | 8/2009 | Gorobets |
| 2009/0228662 A1 | 9/2009 | Chang et al. |
| 2009/0248952 A1 | 10/2009 | Radke et al. |
| 2009/0259799 A1 | 10/2009 | Wong |
| 2009/0262577 A1 | 10/2009 | Tanaka |
| 2009/0271562 A1 | 10/2009 | Sinclair |
| 2009/0300269 A1 | 12/2009 | Radke et al. |
| 2010/0125695 A1 | 5/2010 | Wu et al. |
| 2010/0146197 A1 | 6/2010 | Gorobets |
| 2010/0153631 A1 | 6/2010 | Moon et al. |
| 2010/0169540 A1 | 7/2010 | Sinclair |
| 2010/0169588 A1 | 7/2010 | Sinclair |
| 2010/0172179 A1 | 7/2010 | Gorobets et al. |
| 2010/0174846 A1 | 7/2010 | Paley et al. |
| 2010/0205352 A1 | 8/2010 | Chu et al. |
| 2010/0217926 A1 | 8/2010 | Sinclair |
| 2010/0223423 A1 | 9/2010 | Sinclair et al. |
| 2010/0262765 A1 | 10/2010 | Cheon et al. |
| 2010/0274952 A1 | 10/2010 | Lee |
| 2011/0022778 A1 | 1/2011 | Schibilla et al. |
| 2011/0055455 A1 | 3/2011 | Post et al. |
| 2011/0107042 A1 | 5/2011 | Herron |
| 2011/0138100 A1 | 6/2011 | Sinclair |
| 2011/0149650 A1 | 6/2011 | Huang et al. |
| 2011/0161621 A1 | 6/2011 | Sinclair et al. |
| 2011/0219180 A1 | 9/2011 | Cheon et al. |
| 2011/0252187 A1 | 10/2011 | Segal et al. |
| 2011/0296089 A1 | 12/2011 | Seol et al. |
| 2012/0005405 A1 | 1/2012 | Wu et al. |
| 2012/0017038 A1 | 1/2012 | Gorobets et al. |
| 2012/0030409 A1 | 2/2012 | Post et al. |
| 2012/0066443 A1 | 3/2012 | Li et al. |
| 2012/0084489 A1 | 4/2012 | Gorobets et al. |
| 2012/0151124 A1 | 6/2012 | Baek |
| 2012/0221784 A1 | 8/2012 | Ban |
| 2012/0239851 A1 | 9/2012 | Calvert et al. |
| 2012/0246391 A1 | 9/2012 | Meir et al. |
| 2012/0254574 A1 | 10/2012 | Sinclair et al. |
| 2012/0260028 A1 | 10/2012 | Lee et al. |
| 2012/0297121 A1 | 11/2012 | Gorobets et al. |
| 2012/0297122 A1 | 11/2012 | Gorobets et al. |
| 2012/0311197 A1 | 12/2012 | Larson et al. |
| 2012/0311237 A1 | 12/2012 | Park |
| 2013/0019051 A1 | 1/2013 | Somanache et al. |
| 2013/0019058 A1 | 1/2013 | Caraccio et al. |

(56) References Cited

U.S. PATENT DOCUMENTS

| | | |
|---|---|---|
| 2013/0024641 A1 | 1/2013 | Talagala et al. |
| 2013/0042067 A1 | 2/2013 | Thomas |
| 2013/0138912 A1 | 5/2013 | Bux et al. |
| 2013/0159601 A1 | 6/2013 | Lassa et al. |
| 2013/0173844 A1 | 7/2013 | Chen et al. |
| 2013/0173874 A1 | 7/2013 | Sprouse et al. |
| 2013/0219146 A1 | 8/2013 | Confalonieri |
| 2013/0265825 A1* | 10/2013 | Lassa .................. G06F 3/0619 365/185.11 |
| 2014/0006898 A1 | 1/2014 | Sharon et al. |
| 2014/0068152 A1 | 3/2014 | Sinclair |
| 2014/0143483 A1 | 5/2014 | Meir et al. |
| 2014/0185376 A1 | 7/2014 | Sinclair et al. |
| 2014/0189205 A1 | 7/2014 | Sinclair et al. |
| 2014/0189206 A1 | 7/2014 | Sinclair et al. |
| 2014/0189207 A1 | 7/2014 | Sinclair et al. |
| 2014/0189208 A1 | 7/2014 | Sinclair et al. |
| 2014/0189209 A1 | 7/2014 | Sinclair et al. |
| 2014/0189210 A1 | 7/2014 | Sinclair et al. |
| 2014/0223087 A1 | 8/2014 | Caraccio et al. |
| 2014/0237169 A1 | 8/2014 | Manning |

FOREIGN PATENT DOCUMENTS

| | | |
|---|---|---|
| EP | 1693759 A2 | 8/2006 |
| EP | 2042995 A1 | 4/2009 |
| WO | WO 2007/019155 A1 | 2/2007 |
| WO | WO 2007/019217 A1 | 2/2007 |
| WO | WO 2009/107426 A1 | 9/2009 |
| WO | WO 2012/158521 A1 | 11/2012 |
| WO | WO 2012/161659 A1 | 11/2012 |

OTHER PUBLICATIONS

Office Action for related U.S. Appl. No. 14/928,732 dated Apr. 13, 2017.

Commonly owned related application for U.S. Appl. No. 14/928,606, filed Oct. 30, 2015, 106 pgs.

Commonly owned related application for U.S. Appl. No. 14/928,649, filed Oct. 30, 2015, 106 pgs.

Commonly owned related application for U.S. Appl. No. 14/928,732, filed Oct. 30, 2015, 104 pgs.

Commonly owned related application for U.S. Appl. No. 14/928,845, filed Oct. 30, 2015, 105 pgs.

* cited by examiner

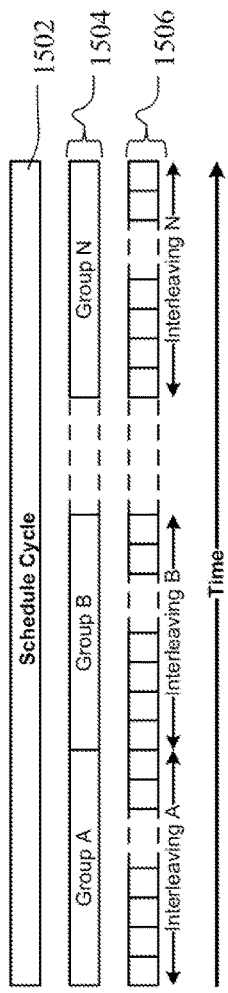

METHOD AND SYSTEM FOR PROGRAMMING A MULTI-LAYER NON-VOLATILE MEMORY HAVING A SINGLE FOLD DATA PATH

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory generally provides highest performance when the number of data bits per cell is lowest, such as binary flash, also known as single level cell (SLC) flash that stores one bit per cell. Flash memory that is configured to store more than one bit per cell, known as multi-level cell (MLC) flash, can store two or more bits of information per cell. While SLC flash memory is generally known for having better read and write performance (e.g., speed and endurance) than MLC flash, MLC flash provides more storage capacity and is generally less expensive to produce. The endurance and performance of MLC flash tends to decrease as the number of bits per cell of a given MLC configuration increases.

In a number of existing non-volatile memory systems, SLC and MLC are used together to try and capitalize on the advantages of each type of memory. The SLC memory may be used for its faster performance and the MLC for its greater storage density. For example, an SLC portion of a memory may be used as a buffer for data being written to the MLC memory, to support fast burst writes of data received from a host, and as the storage area of choice for frequently updated data in a memory system. Regardless of the type of non-volatile memory, the responsiveness of a non-volatile memory system may be affected by its ability to manage internal maintenance operations to generate or maintain enough free blocks to handle subsequent host write requests.

BRIEF DESCRIPTION OF THE DRAWINGS

FIG. 15 is a diagram illustrating programming schedule cycle interleaving executable as part of the process of FIG. 14.

FIG. 16 is chart of example interleave cycles and interleave groups for a schedule cycle based on a schedule cycle type and source block selected according to the process of FIG. 14.

DETAILED DESCRIPTION

Figure 1A:
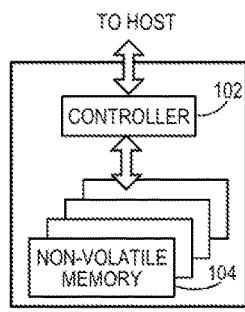
FIG. 1A is a block diagram of an example non-volatile memory system.

By way of introduction, the below embodiments relate to systems and methods for managing programming in a multi-layer non-volatile memory so that impact on responsiveness to host commands may be reduced. As set forth in greater detail below, a non-volatile memory having multiple die layers of different bit-per-cell storage capacity may be configured with a limited number of open block types and with on-chip folding between layers. By limiting the number of data paths between layers and utilizing on-chip copying for a fold operation between a lower bit per cell capacity layer to a higher bit per cell capacity layer, power savings and performance benefits are possible.

In one embodiment, a method of managing data includes, in a non-volatile memory system having a non-volatile memory with a plurality of layers and a controller in communication with the at least one non-volatile memory, only directing data received from a host to a first of the plurality of layers. Prior to programming the data received from the host into the first layer, a determination is made as to whether a maintenance operation is necessary for the first layer. In response to determining that the maintenance operation is necessary for the first layer, a maintenance cycle type is selected from a predetermined set of maintenance cycle types for the non-volatile memory based on a status of the first layer. When the selected maintenance cycle type includes instructions to transfer data from the first layer to a second layer of the plurality of layers, the selected maintenance cycle type is executed by transferring valid data from the first layer to a single open block in the second layer, where the non-volatile memory system only assigns a new open block in the second layer for receiving data from the first layer after the single open block is fully programmed.

In another embodiment, a memory system is disclosed. The memory system includes at least one non-volatile memory having a first layer and a second layer of non-volatile memory cells, where the first layer has only non-volatile memory cells configured at a first bit-per-cell capacity and the second layer has only non-volatile memory cells configured at a second bit-per-cell capacity that is greater than the first bit-per-cell capacity. Data management circuitry is in communication with the at least one non-volatile memory and includes data flow path circuitry, maintenance manager circuitry, and program interleaving circuitry. The data flow path circuitry defines multiple predetermined data paths for programming data received from a host or maintenance operation data into the first layer, but only a single data path for programming any data into the second layer. The maintenance manager circuitry is configured to select a foreground maintenance schedule to free space in at least one of the first and second layers based on a status of at least one of the first and second layers. The program interleaving circuitry is configured to interleave programming of data received from the host with maintenance operation writes for the foreground maintenance schedule selected by the maintenance manager circuitry along one or more data paths defined by the data flow path circuitry.

In yet another embodiment, a memory system is provided with at least one non-volatile memory having a plurality of layers, each of the plurality of layers having a different bit-per-cell data capacity and a plurality of memory blocks. The memory system also includes a controller in communication with the at least one non-volatile memory, wherein the controller is configured to identify a type of data received from a host and determine whether a maintenance operation is necessary in the first layer before programming the received data. The controller is also configured to select a maintenance cycle type from a predetermined set of maintenance cycle types based on a status of the first layer of the plurality of layers. The controller also is configured to, when the selected maintenance cycle type includes instructions to move data to the second layer of the plurality of layers, interleave programming of an amount of the received data into the first layer with re-programming of valid data from a closed block in the first layer to the second layer. The controller is configured to only direct data received from the host to the first layer and to only permit programming of data into an open maintenance block in the second layer from the first layer via an on-chip copy operation.

In some embodiments, the method and/or memory system further includes the act of determining the maintenance schedule type based on a status of the first or second layers. The status of the layers may be a factor of the number of free blocks or amount of valid data in the layers. In some embodiments, the non-volatility memory consists of a multiple non-volatile memory die and an available non-volatile memory die is selected for programming data received from the host based on criteria such as a length of a programming queue for that non-volatile memory die.

In some embodiments, the controller is configured to determine an amount of host data and maintenance data to interleave for a selected foreground maintenance programming schedule type. The determination may vary between foreground maintenance cycles based on the amount of valid data in the selected source block.

In some embodiments, the memory is a three-dimensional memory and/or the memory system is embedded in a host or is removably connected to a host.

Other embodiments are possible, and each of the embodiments can be used alone or together in combination. Accordingly, various embodiments will now be described with reference to the attached drawings.

Exemplary Embodiments

Figure 1B:
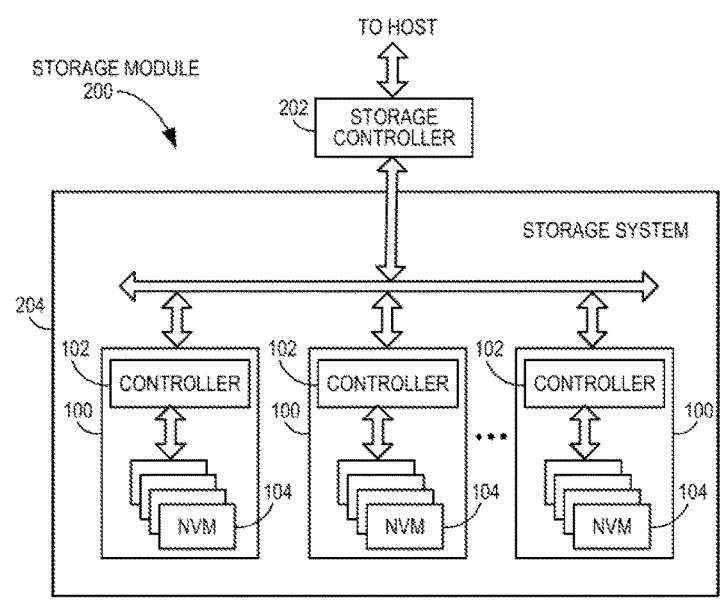
FIG. 1B is a block diagram illustrating an exemplary storage module.
Figure 1C:
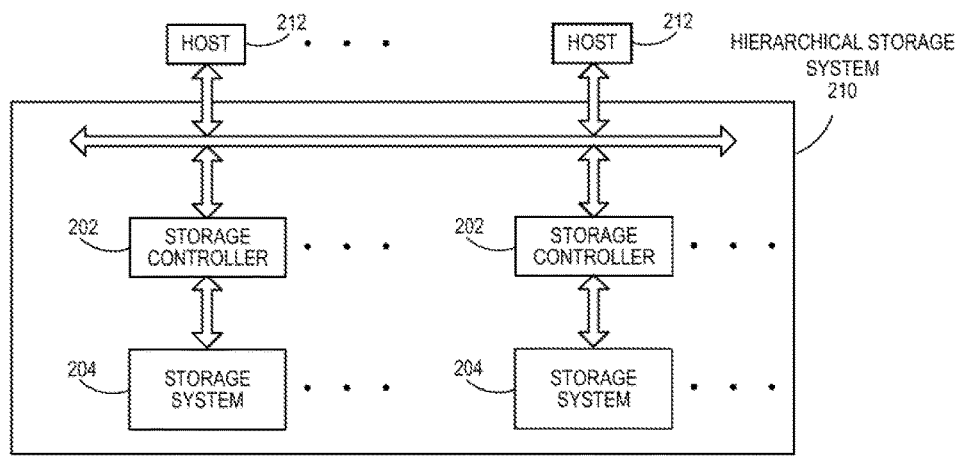
FIG. 1C is a block diagram illustrating a hierarchical storage system.

Examples of suitable non-volatile memory arrangements in which the systems and methods disclosed herein may be used are illustrated in FIGS. 1A-1C. FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 210 includes a plurality of storage controllers 202, each of which control a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
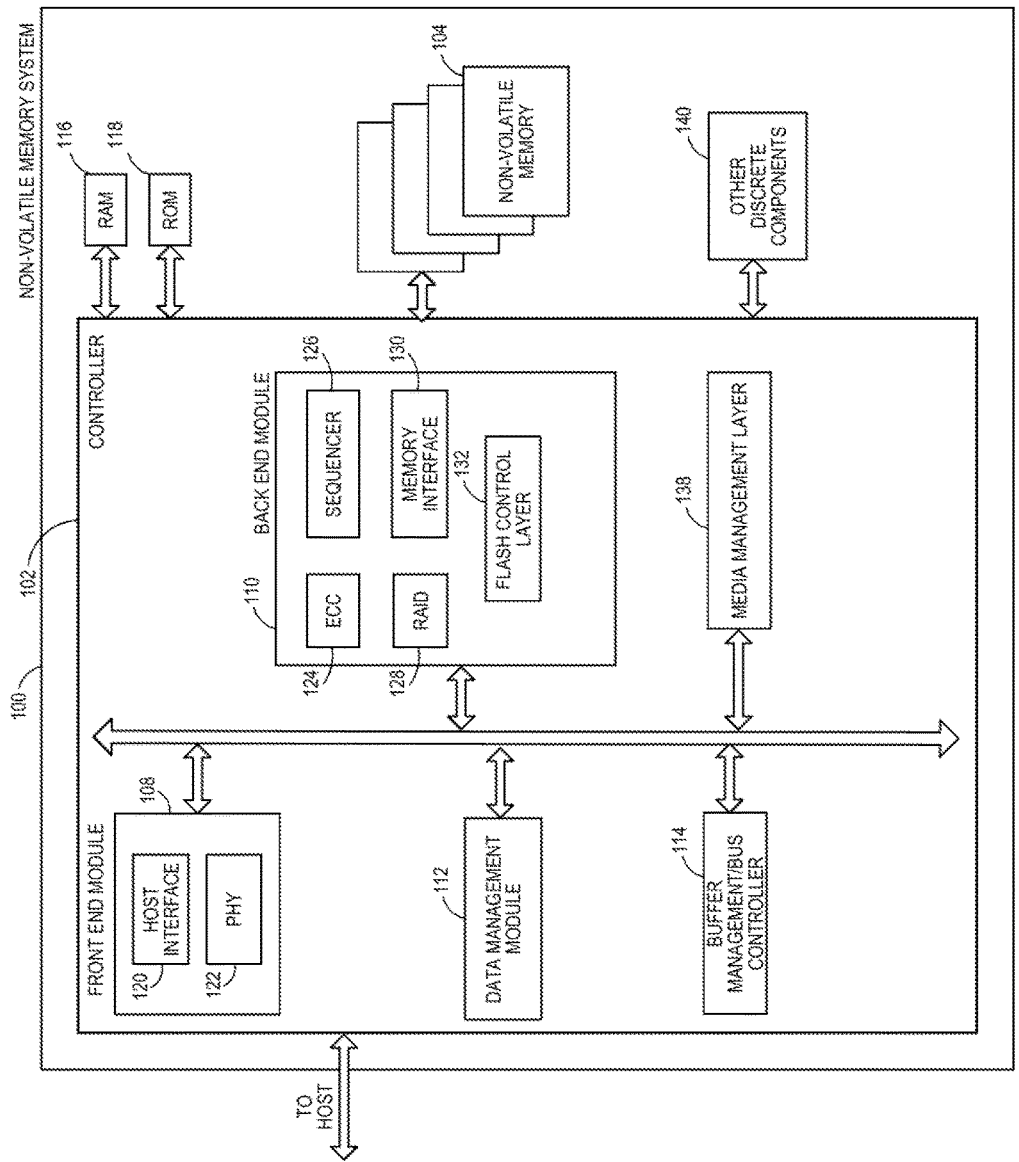
FIG. 2A is a block diagram illustrating exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a data management module 112 present on the die of the controller 102. As explained in more detail below in conjunction with FIGS. 5-6 and 17, the data management module 112 may implement the programming and maintenance operations of a bank of non-volatile memory to each non-volatile memory die in the bank. The data management module 112 handles the scheduling of maintenance and host write operations in a schedule cycle for the non-volatile memory such that the schedule cycle balances consumption of space with creation of free space. As described in greater detail below, in embodiments having a non-volatile memory with a plurality of non-volatile memory die, the non-volatile memory die are operated asynchronously and independently such that multiple non-volatile memory die may concurrently have schedule cycles balancing consumption and creation of free space in each respective non-volatile memory die.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller 102. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller.

The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
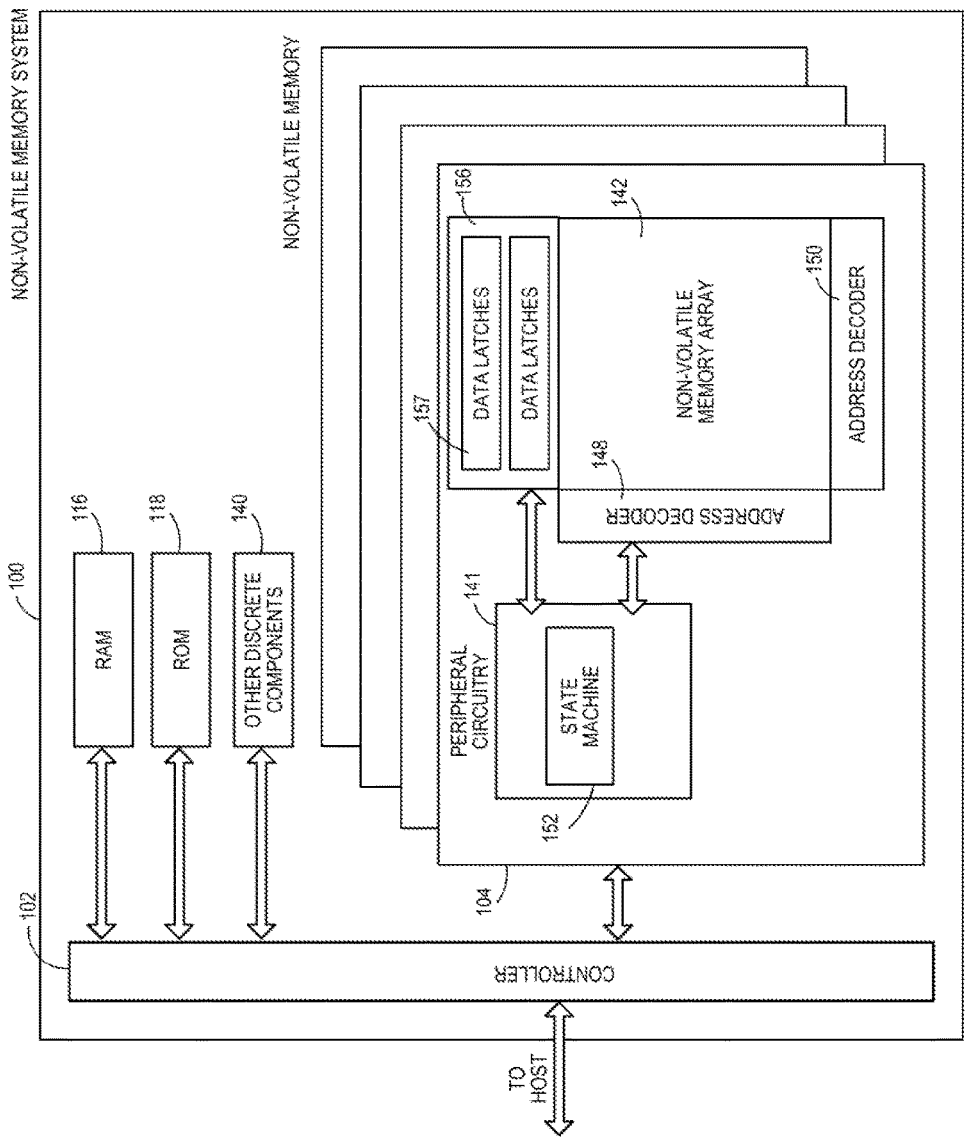
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data. The data cache comprises sets of latches 157 for each bit of data in a memory page of the non-volatile memory array 142. Thus, each set of latches 157 is a page in width and a plurality of sets of latches 157 may be included in the data cache 156. The controller 102 may be implemented in a single integrated circuit chip and may communicate with the different layers of memory in the non-volatile memory die 104 over one or more command channels. Controller executable code for implementing memory management instructions such as described herein may be stored in the non-volatile flash memory.

Figure 3:
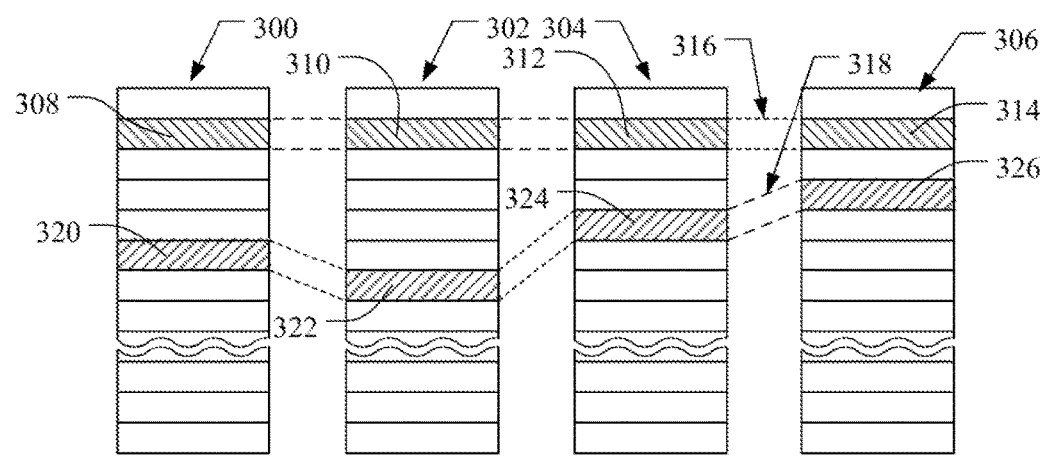
FIG. 3 illustrates an example physical memory organization of the non-volatile memory system of FIG. 1A.

The non-volatile flash memory array 142 may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock. Referring to FIG. 3, a conceptual illustration of a representative flash memory cell array is shown. Four planes or sub-arrays 300, 302, 304 and 306 of memory cells may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 3 by rectangles, such as blocks 308, 310, 312 and 314, located in respective planes 300, 302, 304 and 306. There may be dozens or hundreds of blocks in each plane. Blocks may be logically linked together to form a metablock that may be erased as a single unit. For example, blocks 308, 310, 312 and 314 may form a first metablock 316. The blocks used to form a metablock need not be restricted to the same relative locations within their respective planes, as is shown in the second metablock 318 made up of blocks 320, 322, 324 and 326.

Figure 4:
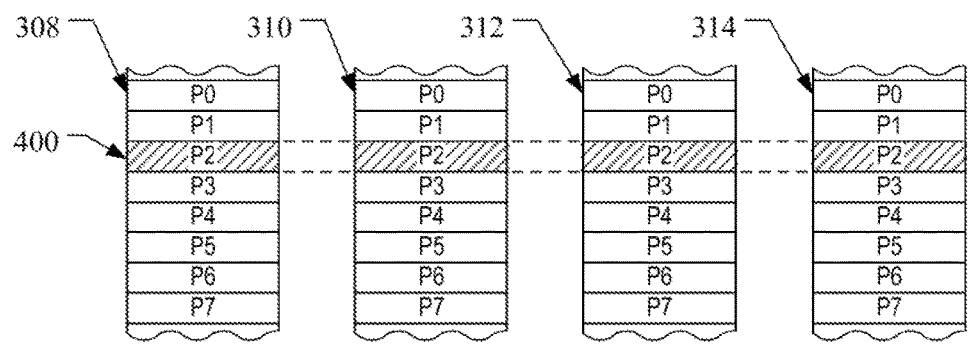
FIG. 4 shows an expanded view of a portion of the physical memory of FIG. 3.

The individual blocks are in turn divided for operational purposes into pages of memory cells, as illustrated in FIG. 4. The memory cells of each of blocks 308, 310, 312, and 314, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 400 is illustrated in FIG. 4 as formed of one physical page for each of the four blocks 308, 310, 312 and 314. The metapage 400 includes the page P2 in each of the four blocks but the pages of a metapage need not necessarily have the same relative position within each of the blocks. A metapage is the maximum unit of programming. The blocks disclosed in FIGS. 3-4 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host. The LBAs are then mapped to one or more physical blocks in the non-volatile memory system 100 where the data is physically stored.

Figure 5A:
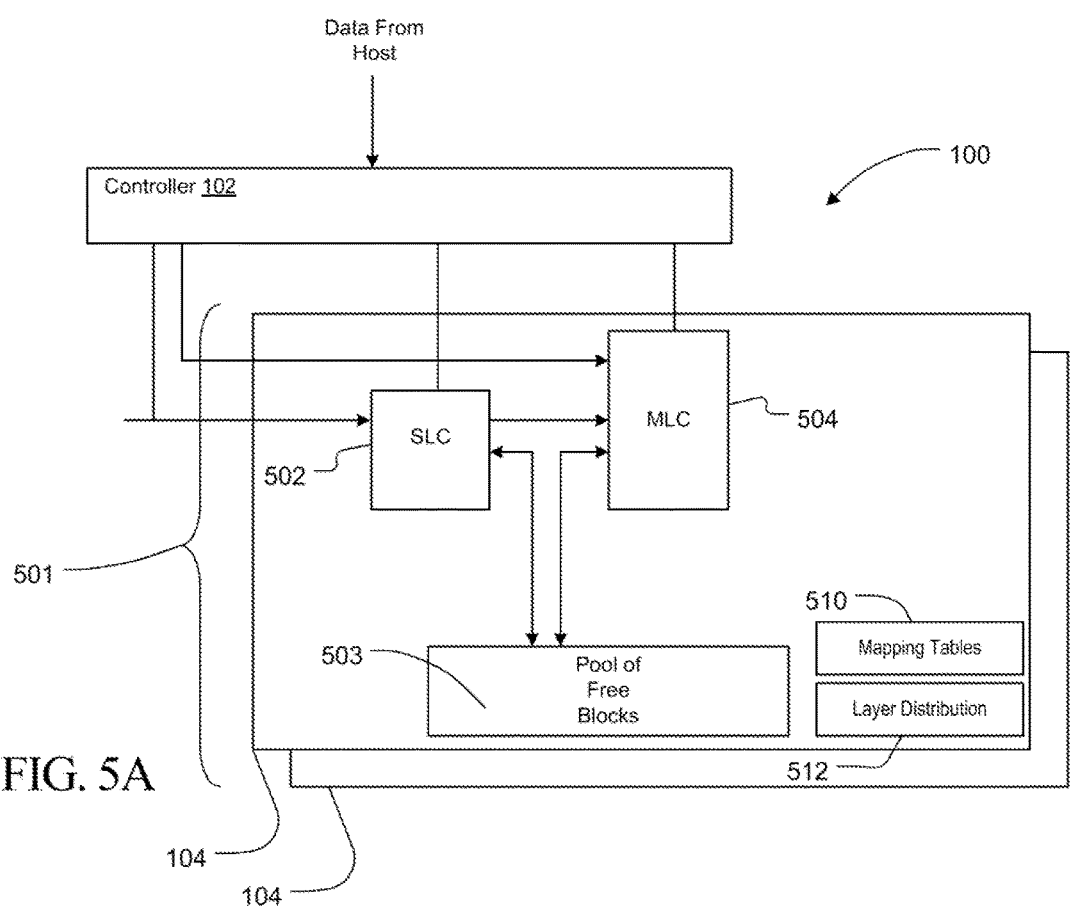
FIG. 5A illustrates an embodiment of the non-volatile memory storage system of FIG. 1A with a non-volatile memory having cells programmable into different bit-per-cell capacities.

Referring now to FIG. 5A, an embodiment of the non-volatile memory system 100 of FIG. 1 is shown having non-volatile memory 501 consisting of one or more non-volatile memory die 104, where each die, or group of die that are managed together as an independent managed set (also referred to herein as a metadie), includes a common pool 503 of free blocks of non-volatile memory cells programmable into any of two or more layers 502, 504 in the non-volatile memory 501. Each layer 502, 504, also referred to herein as a die layer, includes only blocks of memory cells configured with a same bit per cell capacity and each layer having a different bit-per-cell capacity than the other layer.

Also, as explained in greater detail with respect to FIGS. 5B and 5C below, the non-volatile memory 501 of the general example of FIG. 5A may be arranged as individually managed non-volatile memory die 104, a whole number set of non-volatile die that are managed together, or a combination of the two. Each layer of a non-volatile memory die (FIG. 5B) or an independently managed set of non-volatile memory die (FIG. 5C) has memory cells of a different bit per cell capacity than each other layer in the non-volatile memory die or independently managed set.

For example, a first memory layer 502 may be configured as binary layer having blocks of non-volatile memory cells with a single bit per cell capacity, also referred to herein as a single level cell (SLC) or X1 layer. A second memory layer 504 may be configured with blocks of non-volatile memory cells having more than one bit per cell storage capacity, sometimes referred to as multi-level cell (MLC) flash memory. In one implementation the MLC memory layer 504 may be a two bit per cell memory, also referred to herein as X2 memory, while in other embodiments the MLC memory layer 504 may be three bit per cell memory, also referred to herein as X3 memory. Other combinations of bit per cell capacity layers are also contemplated. More than two layers are also contemplated in other implementations.

In one implementation, the separate layers 502, 504 are not fixed in size and may be dynamically resized through block reclaim operations and retasking free blocks from the free block pool 503 into either of the layers at the appropriate bit per cell capacity utilized by each respective layer. Alternatively, the layers may be fixed in size and each have a separate free block pool 503 exclusively associated with that particular layer. Also, as used herein, the die layers 502, 504 refer to groups of blocks having memory cells configured in a particular bit-per-cell capacity and do not require any particular physical arrangement of the cells or layers with respect to one another.

Figure 5B:
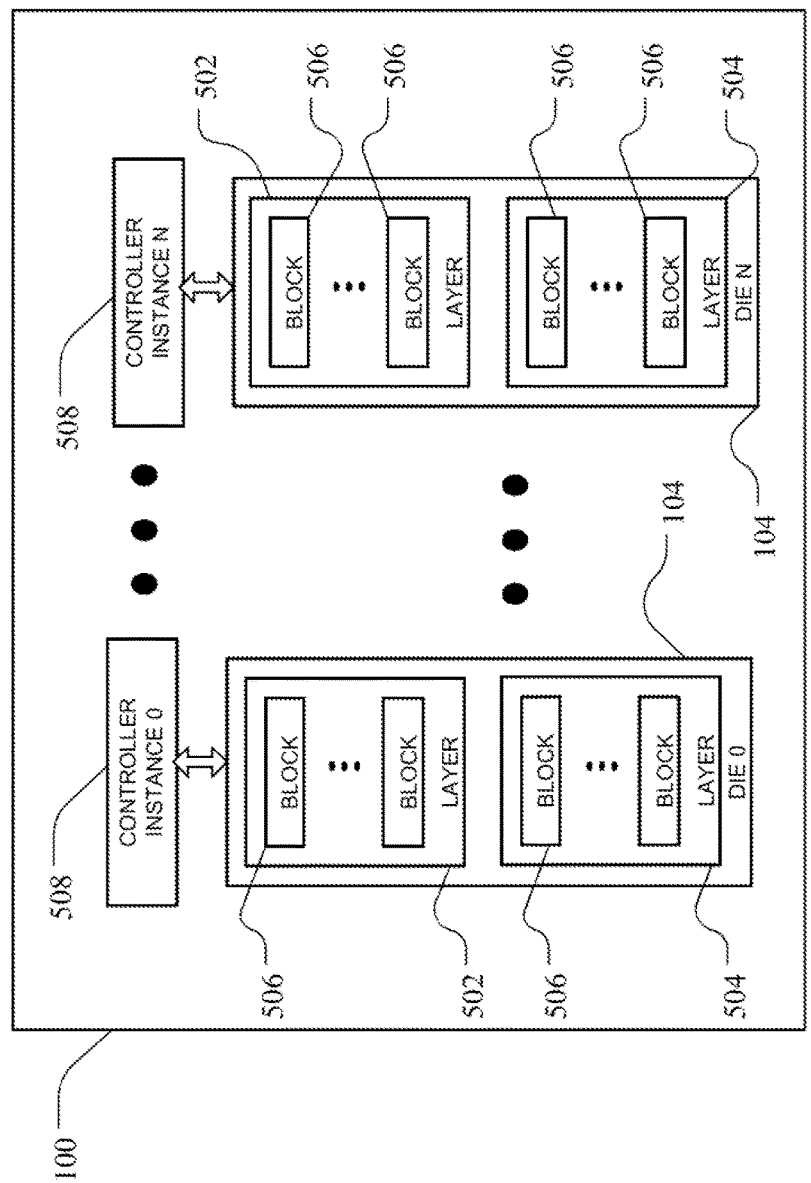
FIG. 5B illustrates an arrangement of the storage system of FIG. 5A with a non-volatile memory having two layers contained in each non-volatile memory die within the non-volatile memory, where each layer is made up cells having a particular bit-per-cell capacity and each layer has a different bit-per-cell capacity.

Referring to FIG. 5B, an example non-volatile memory 501 in the non-volatile memory system 100 is shown having each die 104 independently managed by its own controller instance 508. In this embodiment, each layer 502, 504 is defined by a blocks 506 of a particular bit per cell capacity that are within the single die 104. Each die 104 may be independently and asynchronously managed by a separate instance 508 of the controller 102 of the non-volatile memory system 100. A controller 508 instance may be a separate thread of a single controller 102, or a separate hardware of firmware implementation. Also, each non-volatile memory die in FIG. 5B handles its own multiple layers independently of the layers in each other die. As used herein, the term die refers to the set of non-volatile memory cells, and associated circuitry for managing the physical operation of those non-volatile memory cells, that are formed on a single semiconductor substrate.

Figure 5C:
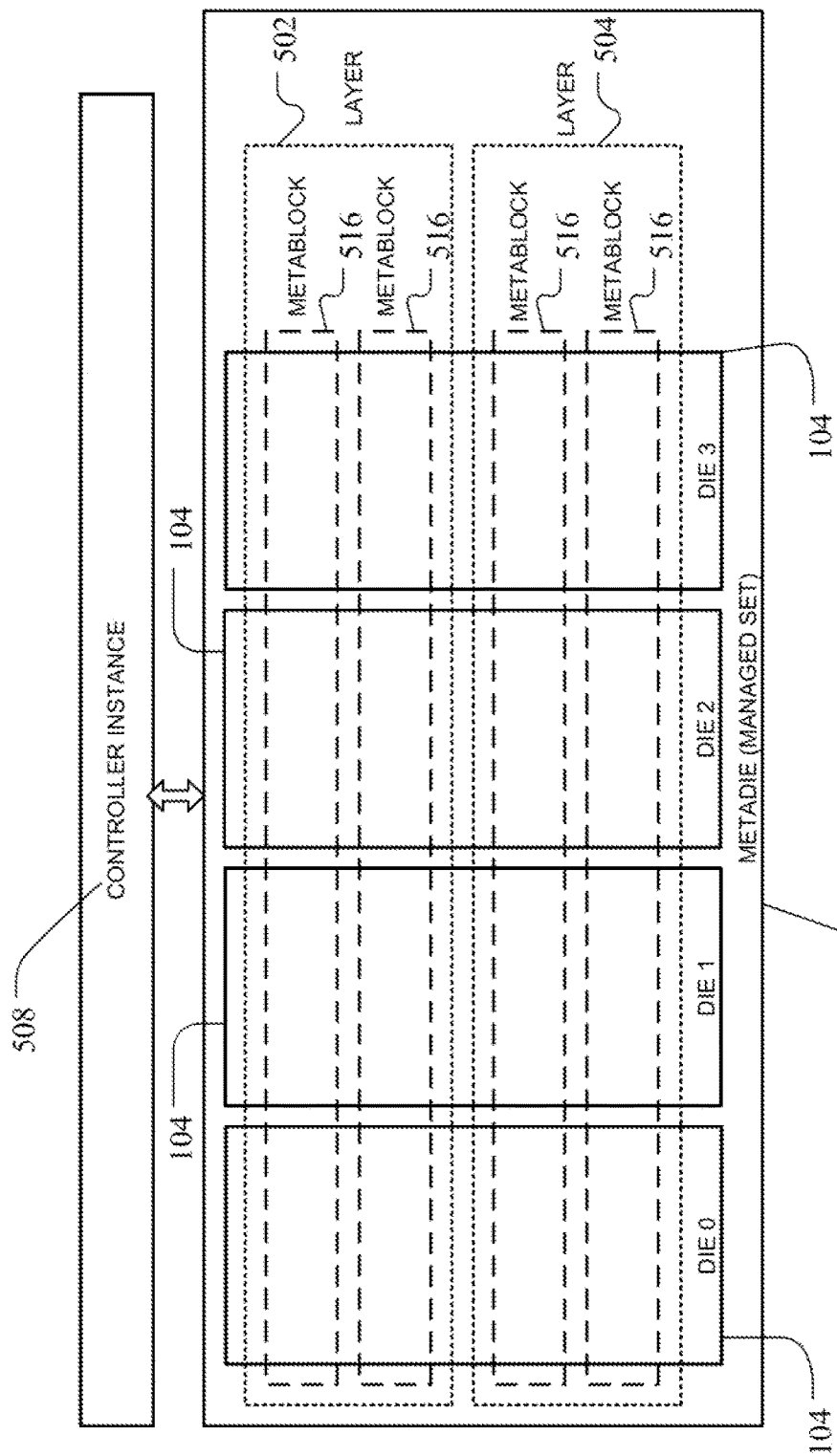
FIG. 5C is an alternative arrangement of the storage system of FIG. 5A, where the non-volatile memory of the storage system includes independently managed sets of non-volatile memory die having two layers of different bit-per-cell capacity cells that span across all the non-volatile memory die in the independently managed set.

Referring to FIG. 5C, in other embodiments the non-volatile memory is arranged in one or more independently managed sets of non-volatile memory die, where each managed set, also referred to as a metadie, is a whole number of non-volatile memory die 104 being managed as a single unit by a separate controller instance 508. For an independently managed set 514 of non-volatile memory die, the memory layers 502, 504 may be formed across the multiple separate non-volatile memory die 104 in the managed set 514. Thus, in contrast to the layers in the individually managed die of FIG. 5B that are made up of blocks 506 completely contained within each independently managed die 104, the layers 502 and 504 in the embodiment of FIG. 5C are made up of metablocks 516 that include at least one block on each of the non-volatile memory die in the independently managed set 514 of die (or metadie).

A single independently managed set of die is shown in FIG. 5C, but multiple independently managed sets could be included in a single non-volatile memory system 100. Additionally, a mix of single die with multiple layers contained within that die and independently managed sets of two or more non-volatile memory die with multiple layers across that managed set are also contemplated in a single non-volatile memory system 100. In embodiments with multiple independently managed sets of non-volatile memory die, the layers in each of the independently managed sets are handled separately from the layers in any other independently managed set. Although specific bit per cell configurations of SLC and MLC are illustrated in FIG. 5A, other combinations are contemplated where the first memory layer has a lower bit per cell configuration than the second flash memory layer. If more than two layers are present in a die or metadie, then each additional layer, in turn, may have a higher bit per cell configuration than the prior memory layer.

Referring again to the generic representation in FIG. 5A of the different single die and multiple die layer structures in FIGS. 5B and 5C, one or more mapping tables 510, such as logical-to-physical mapping tables, storage address tables and so on, may be stored in non-volatile memory cells of any of the layers 502, 504 of the non-volatile memory 501. Additionally, a memory layer distribution data structure 512 (such as a table) or a memory layer distribution algorithm representing a predetermined desired physical capacity and overprovisioning for each memory layer at different storage system fullness levels, may be stored in one or more of the layers 502, 504.

It is contemplated that the mapping tables 510 and memory layer distribution data structure 512 may be specific to each non-volatile memory die 104 or metadie 514. Additionally, the free block pool 503 present in each die 104 or metadie 514 may be a single pool such that any block from the free block pool may be assigned to a particular layer, reconfiguring the free block as necessary for use at the appropriate bit-per-cell capacity of the destination layer. In embodiments where one or more portions of the non-volatile memory in the non-volatile memory system 100 are organized as a metadie 514 as in FIG. 5C, then the free block pool 503 in each die of that managed set would contribute to a metablock, comprising at least one block in each of the die in the managed set, that would be configured to the bit-per-cell configuration of the destination layer. Alternatively, each die or metadie may have a different free block pools for each layer.

Figure 6:
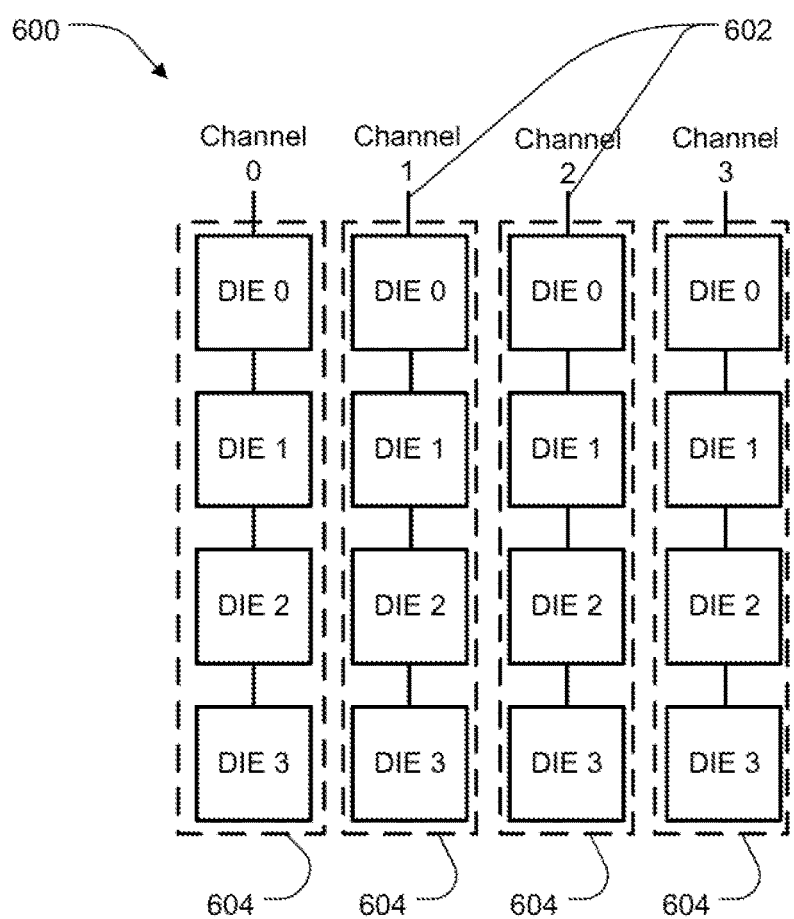
FIG. 6 illustrates an example array of non-volatile memory die organized into banks of memory according to channels.

Although a small group of individually managed non-volatile memory die 104, and an individual metadie 514, are shown in FIGS. 5B and 5C, arrays of memory die are contemplated such as shown in FIG. 6. The array 600 of non-volatile memory die may be made up of non-volatile memory die organized on separate channels 602, where all the die on a channel 602 comprises a memory bank 604, such that four memory banks are illustrated in FIG. 6. Alternatively, die in a memory bank may also be located across multiple memory channels. Each channel 602 may be associated with a separate controller 102 or all channels may be associated with a single controller 102. With reference to FIG. 6, the die (DIE 0-DIE 3) on each channel 602 may represent either individual non-volatile memory die 104 or metadie 514.

Asynchronous Management

In order to increase performance of a memory system, the memory system may operate each of the non-volatile memory die or metadie asynchronously and independently of each other non-volatile memory die or metadie. Referring to FIG. 6, if each channel 602 is managed as a separate bank 604 and each channel has a separate controller instance 508 (FIG. 5B), the controller instance may handle data programming on a die-by-die level, including selection of the best die on the single channel for a particular operation based on its availability.

In a multiple controller embodiment, such as shown in FIG. 5B, the controller instances 508 may use any of a number of address translation algorithms for managing movement of data to, within and between die layers as set forth below. Each controller instance may be assigned a particular LBA address range for host data and manage data in that range in the die or metadie associated with that controller. In implementations of a memory system having a single controller, the controller manages all die on one or many channels 602, the controller may be the same type of controller with the same algorithms as a multi-controller embodiment. The single controller embodiment simply manages the full address mapping for die and channel for all data in the non-volatile memory array 600 rather than receiving data in a specific LBA address range associated with a particular controller/channel as discussed with respect to the multi-controller embodiments having a separate controller per channel.

The data management module 112 in the controller 102 may include an asynchronous die algorithm, in which write transactions throughout the system 100 relate to the programming parallelism of one die, designated a die-page. Metablocks are formed across planes within a single die 104. Multiple die can operate concurrently on contiguous operations, or can operate asynchronously with each performing unrelated operations.

Each write transaction for data from a host may be issued to the relevant die layer 502, 504 in any die 104. The die that will allow highest data throughput to be maintained may be selected, based on status information about the die layer. The asynchronous die algorithm is designed to provide reduced latency for execution of host commands and improved performance with workloads having irregular I/O size or mixed read/write characteristics. Unlike controllers configured for synchronous operations that utilize metablocks spanning multiple die, asynchronous die operations can allow all good metablocks within each die to be used and can make use of the full physical overhead available to it, thereby maximizing the performance of the memory system.

For ease of illustration, and to avoid repetition, the features described below are generally explained in the context of the multiple controller arrangement of FIGS. 5B and 6, where each controller instance 508 manages a separate die or bank of die independently of each other die or bank of die. It should be understood, however, that all of the features disclosed herein are equally applicable to the single controller embodiment that handles all banks 604.

In one embodiment of the present invention, each controller instance 508 includes an asynchronous die algorithm, in which data programming parallelism and write transactions throughout the system 100 are managed in units of the maximum programming parallelism achievable within one die, which is typically 32 KB in a 2-plane die. Each controller instance 508 is associated with die on only one channel 602, rather than die on separate channels as in a synchronous architecture. In this manner, multiple die can operate fully in parallel when required, or can operate asynchronously with each performing unrelated operations. Additionally, the asynchronous operation permits the controller instance for each set of die it manages on the same channel 602 (bank 604) to select the die that is best suited for receiving the data, for example the die having the shortest queue of data to be written. In a single controller embodiment, the controller 102 would manage all die an all channels 602 and can select any die that is best suited for receiving data.

Asynchronous operation of each die associated with a given controller allows all good blocks within each die to be active. The performance of each die may be maximized by making use of the full physical overhead available to it, thereby maximizing the performance of the memory system. The die selection criteria implemented by the asynchronous die algorithm may include the controller selecting a die only if the die's status information indicates that the required interleaving of maintenance copy operations with host data program operations of the same class (e.g. data type of random or sequential) as the pending transaction has been met. Other criteria, which may be used alone or in combination, may include selecting a die only if the number of outstanding transactions for the target class (e.g. the queue for random write transactions) does not exceed a specified limit; selecting the available die with the lowest number of outstanding transactions; and/or selecting the available die with the lowest logical fullness.

While a specific controller, in non-volatile memory system 100 having multiple controller instances, manages data with LBAs only within a specific subset of host LBA address space, there is no correlation between LBA and die number within a controller instance. Similarly, there is no correlation between the die numbers used by successive controllers to sequentially program successive LBA metapages within a stripe of LBAs spanning the separate die managed by two controllers. Although each controller independently manages its own die on one particular controller channel in one embodiment of an asynchronous architecture, the asynchronous die algorithm can also achieve full parallelism across controllers for data transfer and NAND command execution. A NAND read or program operation on an LBA metapage can be executed in each of the controllers, with fully synchronous data transfer and access operations. This allows fully synchronous execution of read and program operations relating to an LBA address stripe spanning all controllers, such as occur in sequential read and write modes of operation.

Read and program operations relating to two successive LBA stripes spanning an LBA range associated with a controller implementing asynchronous die management can be executed concurrently in two die on the same channel 602, but not fully in parallel. Data transfers to or from the two die is typically serialized, because they are sharing the same channel. The read or program operations in the two die may therefore be overlapped.

The type of inputs received by an asynchronous die algorithm running in each of the controllers may include read, write and trim commands. In embodiments where the asynchronous die algorithm is used in a multi die layer memory system having multiple partitions per die layer, the write commands received may be further divided into write commands for different data types, such as the random and sequential data types described above. In one embodiment, the execution of certain transactions may be ordered such that read transactions are immediately processed, while write and trim commands are processed in the order received. In embodiments where a die metapage is 32 KB, a read transaction may be for any multiple of 2 KB up to a maximum of one die metapage, write transactions are one metapage and a trim transaction has a data payload length of one metapage.

The controller 102 may implement an address translation algorithm within each non-volatile memory die (independently managed as in FIG. 5B), or metadie (set of non-volatile memory die managed as a single unit as in FIG. 5C) to enhance the efficiency of data transfer and memory usage. Any of a number of known memory management techniques may be used to implement the storage system described herein. One advantage of some address translation algorithms is the ability to increase performance of storage systems in random write applications, random write applications being characterized by the need to write short bursts of data to unrelated areas in the logical block address (LBA)

address space of a device, that may be experienced in solid state disk (SSD) applications in personal computers.

In one implementation of an address translation algorithm, host data is mapped from a first logical address assigned by the host (also known as a host logical block address) to blocks of contiguous logical addresses in a second logical address space (also known as a virtual logical block address). As data associated with fully programmed blocks of addresses is made obsolete, a data relocation procedure is initiated where the controller selects a previously fully programmed block in a die having the least amount of valid data, or having less than a threshold amount of valid data, and relocates the valid data in those blocks to free up those blocks for use in writing more data. The relocated data is contiguously written to a relocation block in the same die in the order it occurred in the source block needing data relocation regardless of the logical address assigned by the host. In this manner, overhead may be reduced by not purposely consolidating logical address runs assigned by the host (as in typical garbage collection).

One or more storage address tables (SAT) may be used to track the mapping between the host logical address assigned by the host and the virtual logical address assigned by the storage system and subsequent changes in the mapping due to subsequent relocation. Similarly, storage address tables may be used to track mapping between the virtual logical address assigned by the storage system and the physical address at a die where data is actually stored.

Concurrently with accepting data from the host, the controller reclaims blocks in a maintenance operation by copying valid data from previously programmed blocks having both valid and obsolete data and then recycling the blocks from which all the valid data was copied. This block reclaiming procedure may be in the form of a standard garbage collection technique where groups of data are kept together and consolidated as new data in the same address run is received, or may be a relocation procedure where data is not consolidated into the same address groupings.

Data Management Module

Figure 7:
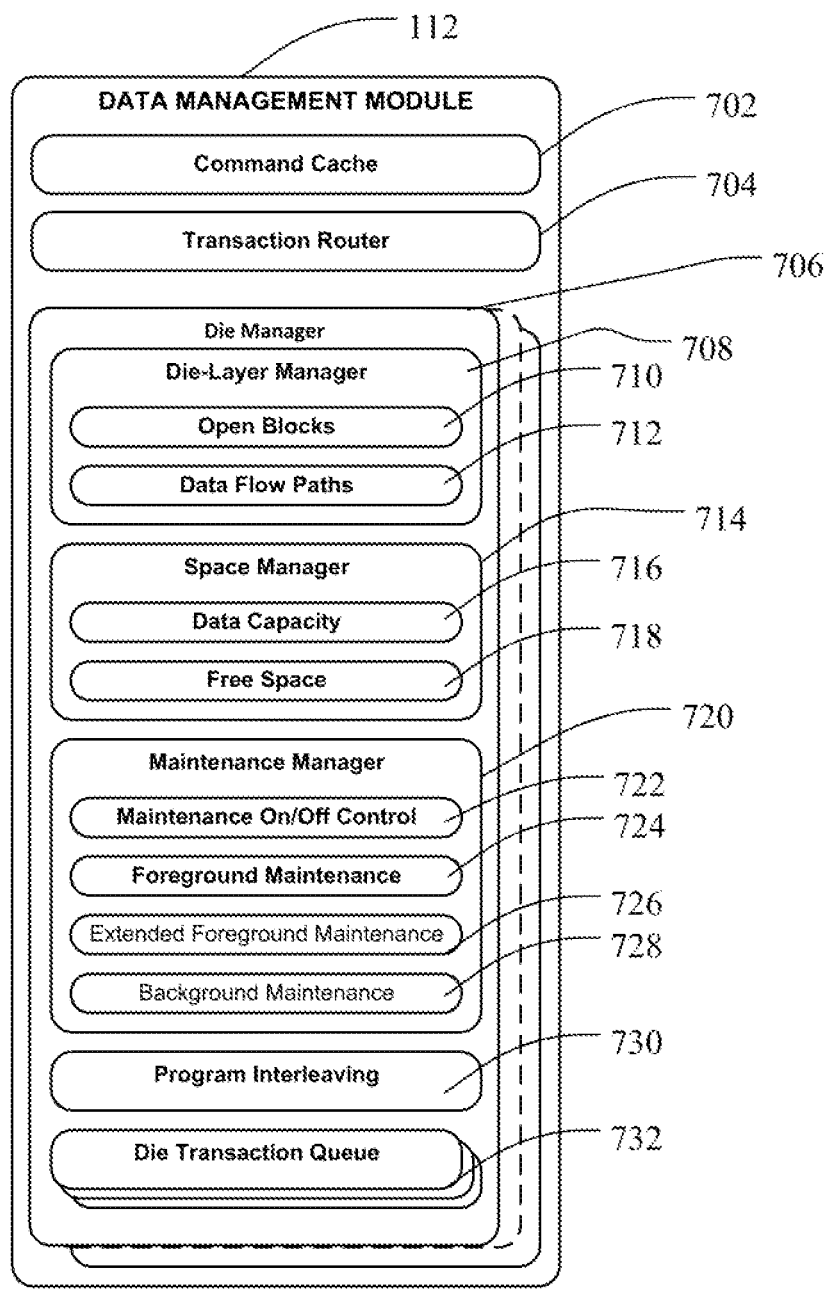
FIG. 7 is an embodiment of a data management module usable with the non-volatile memory system of FIG. 2A.

Referring to FIG. 7, a more detailed illustration of the data management module 112 of FIG. 2A is shown. The data management module may be configured as firmware, hardware, or a combination of the two to execute data management algorithms. As noted previously, the data management module 112 may be part of or outside of the media management layer 138 in the controller. The data management module includes a command cache 702 containing pending host commands from the command manager layer. A transaction router 704 is configured to route transactions to a selected non-volatile memory die in the bank. In one implementation, a separate die manager 706 exists for each non-volatile memory die being managed by the data management module 112. For example, if one data management module 112 is associated with a bank 604 such as the example of FIG. 6 where the bank is configured as the column of four non-volatile memory die 104 associated with channel 0, then four instances of the die manager 706, one for each die in the bank 604, would be present in the data management module 112 for channel 0.

Within each die manager 706, a die layer manager 708 manages the data flows within and between die layers for a particular non-volatile memory die. The die layer manager 708 may include an open block list 710 identifying any open write or maintenance blocks in the die layer and a list of possible data flow paths 712. The types of data flow paths 712 supported may vary based on the type of non-volatile memory die and example data flow paths 712 are provided for embodiments of different non-volatile memory die in FIGS. 12 and 13 below. A space manager 714 in the die manager 706 includes information on the data capacity 716 and free space 718 available in each die layer of the die associated with the die manager 706. The free space 718 may be in the form of a free block list for each die layer in the non-volatile memory die being managed by the die manager 706. A maintenance manager 720 implements the maintenance techniques discussed herein. The maintenance manager 720 may include an on/off control 722, a foreground maintenance algorithm 724, an extended foreground maintenance algorithm 726 and a background maintenance algorithm 828 that each manage maintenance operations for the creation of free space. A program interleaving module 730 in each die manager 706 controls the interleaving of host data writes and maintenance operation writes in the schedule cycles discussed further herein.

A die transaction queue 732 buffers host read, program and erase transactions for execution in the low level sequencer layer 126 of the back end module. The queue 732 thus includes lists of pending host commands that are awaiting execution on each non-volatile memory die and may be used as part of the non-volatile memory die selection process. By accessing the queue in each bank of the memory system to assist in selecting a die for an operation, the data management module may optimize utilization of each die. As noted above, the die transaction queue 732 for each die managed by a particular controller may be used in the die selection process for a given schedule cycle.

Again, a separate instance of a data management module 112 may exist for each memory bank in the system, where a memory bank 604 comprises a subset of the total number of physical die in a non-volatile memory system 100 (e.g. all die on a whole number of channels). The data management module 112 may map a predefined subset of logical address space (a logical bank) to a predefined subset of physical address space (a physical bank). Alternatively, a single instance of the data management module 112 may manage all die in the system 100, which is equivalent to there being only a single bank, both logical and physical.

The data management module 112 maps a unique logical address space to a unique physical address space comprising an integral number of die. It is desirable to produce uniformity of response times to commands within any host workload while avoiding idle time in non-volatile memory die. The data management algorithm executed by the data management module 112 utilizes the non-volatile memory die asynchronously and independently, as discussed above, to increase the utilization of non-volatile memory die and to assist with overall performance of the non-volatile memory system. In addition, as set forth below, the data management module 112 incorporates the use of schedule cycles to balance consumption and creation of free space in each die in an effort to improve uniformity of response times to a host.

Maintenance in a non-volatile memory may consist of 1) operations to re-program valid data from source blocks containing obsolete data to destination blocks, in order to recover usable free space previously occupied by the obsolete data; and 2) operations to manage non-volatile memory characteristics (for example NAND flash memory characteristics), such as wear levelling and read scrub operations. Maintenance operations may also be performed on control data structures such as any mapping tables used in the memory system.

In one implementation, the data management module may generate a schedule for maintenance operations to be interleaved with host write operations for each individual die. The need for maintenance may be determined independently in each die layer, when the die layer must import data and its available free space is below a threshold value. Host data write operations are interleaved with foreground maintenance operations to provide better uniformity of response times to host data write transactions, where foreground maintenance operations are defined herein as those maintenance operations that are implemented when there are pending host commands.

In one implementation, the interleave ratio for a schedule cycle is defined to balance the consumption of free space by host data write operations with the creation of net free space by maintenance operations. The schedule cycle defined herein is based on freeing a selected source block by moving the valid data from the selected source block to a relocation block and then only allowing an amount of host data to be written to a host write block up to the amount of obsolete data that was in the selected source block. In other words, a schedule cycle is completed when the valid data of a selected source block has been moved. During the schedule cycle, an amount of host data up to the amount of obsolete data that existed in the selected source block may be written so that there is a creation of one free block (the selected source block after the valid data is moved) and consumption of no more than one block's worth of capacity (the sum of the valid data moved and the host data accepted) in any given schedule cycle.

With respect to a multi-layer non-volatile memory die, a schedule cycle is a schedule of operations which allows data to cascade between die layers or to be relocated within a die layer, as a consequence of host data being imported by the first of the die layers. More specifically, a maintenance operation in a die layer may be a relocation operation, in which all valid data in a selected relocation source block is re-programmed in a relocation destination block within the same die layer, or a folding operation, in which all valid data from a folding source block is re-programmed into a folding destination block in a different die layer.

Within a given schedule cycle, a non-volatile memory die operates to achieve an overall required interleave ratio between host program operations and maintenance operations in zero, one or two die layers. A new schedule cycle is started whenever the source block for data being programmed during a maintenance operation no longer contains valid data, thus the selection of operations is made on a source block by source block basis.

Figure 8:
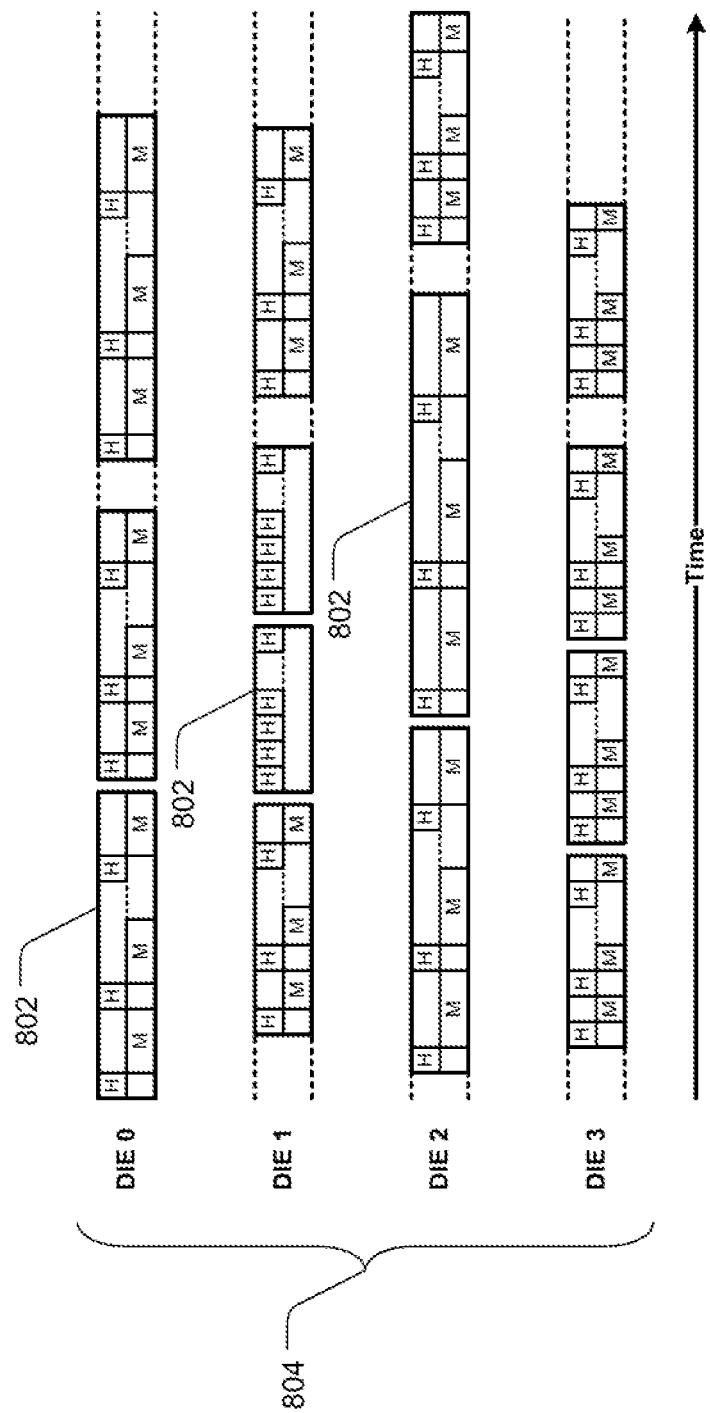
FIG. 8 is an example distribution of schedule cycles consisting of maintenance operations and host write operations among different non-volatile memory die in a non-volatile memory system.

An example of one possible group of schedule cycles for multiple asynchronously operating non-volatile memory die within one bank are illustrated in FIG. 8. FIG. 8 shows an example of the timing of host operations and maintenance operations for a 4 die bank 804 similar to bank 604 in FIG. 6. Each of Die 0 through Die 3 is being operated asynchronously in this example, where the time axis progresses from left to right. Each schedule cycle 802 is separately calculated for each non-volatile memory die based on the selected source block for maintenance in that particular die as described in greater detail below. The die manager 706 of the data management module 112 managing the bank 804, for each die in the bank, interleaves host data writes (H), and maintenance operations (M) such as relocation of valid data from a selected source block in the die to achieve the overall required interleave ratio determined for each die at the beginning of each schedule cycle. Thus, as illustrated in FIG. 8, the interleave ratio of host writes H to maintenance operations M for each schedule cycle 802 will change within a die or between each die depending on the source block selected for maintenance.

Trigger for a Schedule Cycle

In one implementation, the trigger for deciding whether to initiate a schedule cycle is based on the free block threshold that is set for each layer of each non-volatile memory die. A minimum number of free blocks may be predetermined for each die layer, and that minimum may be different for each layer or each non-volatile memory die depending on the configuration of the memory system. For example, in non-volatile memory die having X1 and X2 layers, a foreground maintenance operation threshold may be set for each layer such that a maintenance operation will be interleaved with host data writes directed to that particular die and layer whenever the number of free blocks in the layer falls below the foreground maintenance operation threshold. Similarly, in a non-volatile memory die with other combinations of layers, such as the eX3 die 1300 having X1 and X3 die layers 1302, 1304, each die layer may have a different predetermined foreground maintenance threshold that will trigger a maintenance operation in the identified layer as described herein when the number of free blocks falls below the appropriate threshold for that die layer.

The threshold minimum number of free blocks is a product of the desired capacity distribution in a layer and in a die. The physical capacity of a non-volatile memory die is determined by the total number of good blocks in the die, and their fixed separation into X1, X2 or X3 die layers. Total physical capacity of different die may be different, because of their differing number of bad blocks, where bad blocks are those that have been determined to be unsuitable for reliably holding data (e.g. blocks that have passed a wear limit, such as a predetermined program and erase (P/E) count, or have been detected as not retaining data accurately). Each die layer has a designated logical block address (LBA) capacity, which is its maximum capacity for valid data. In one implementation, physical capacity of a die layer exceeds LBA capacity by a guaranteed minimum amount, known as physical capacity overprovisioning. Total data capacity of a die layer may exceed LBA capacity by a guaranteed minimum amount, known as data capacity overprovisioning. The sum of the LBA capacities specified for all die layers in a drive may exceed the LBA capacity of the drive.

Figure 9:
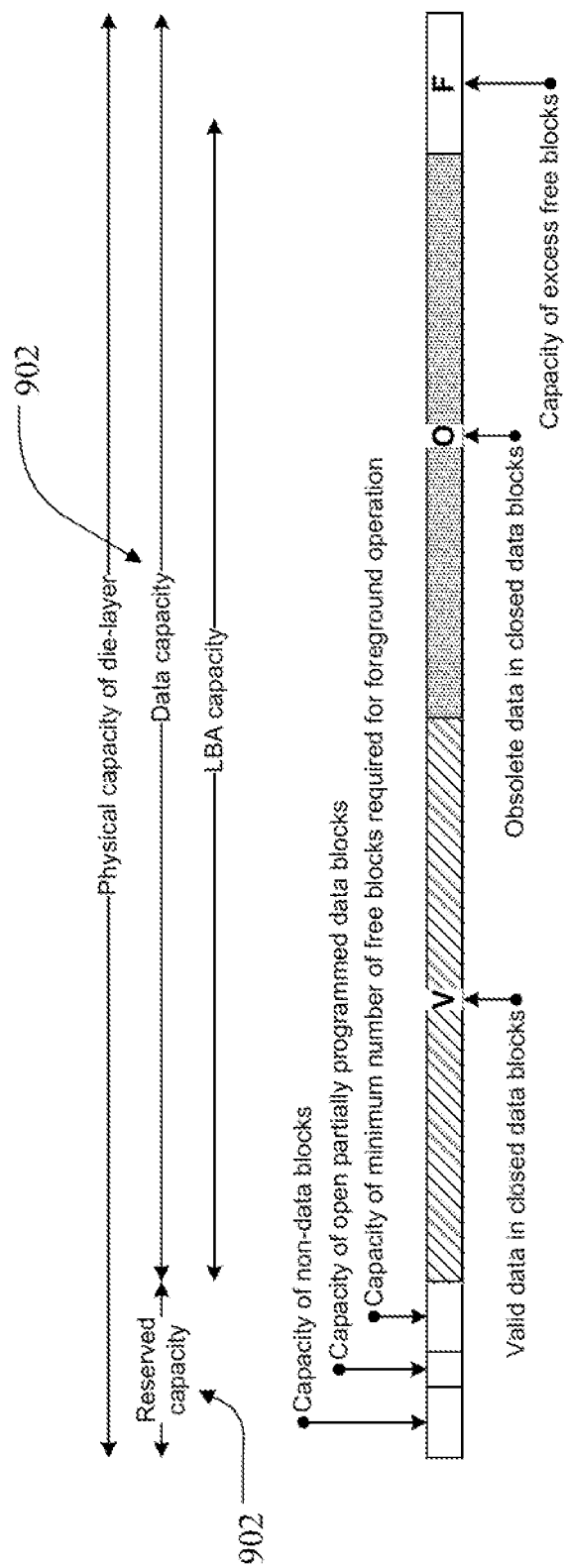
FIG. 9 shows an example data capacity distribution within a die layer of a given non-volatile memory die.

An example of data capacity distribution in one layer of a non-volatile memory die is seen in FIG. 9. The total data capacity in a die layer is the capacity available for data blocks that have been closed after being fully programmed. This total data capacity 902 is the total physical capacity of the die layer minus capacity occupied by reserved blocks. Reserved blocks 904 are blocks for information other than host data, data blocks that have been partially programmed and are still open, and the minimum number of free blocks for foreground operation. Total data capacity may comprise capacity occupied by valid data in closed data blocks (V), obsolete data in closed data blocks (O), and capacity in excess free blocks (F). Excess free blocks F are free blocks in excess of the minimum number of free blocks that are required for foreground operation. After a period of sustained foreground maintenance such as described herein, the distribution of obsolete data in closed blocks O and excess free blocks F may change such that excess free blocks F may be fully consumed by the foreground operation when maintenance operations and host writes are balanced. When no host data is pending for writing to the die layer, then background maintenance operations may take over to free up space beyond the minimum free block threshold for operation such that the obsolete data capacity O will be converted into free block capacity F.

Figure 10:
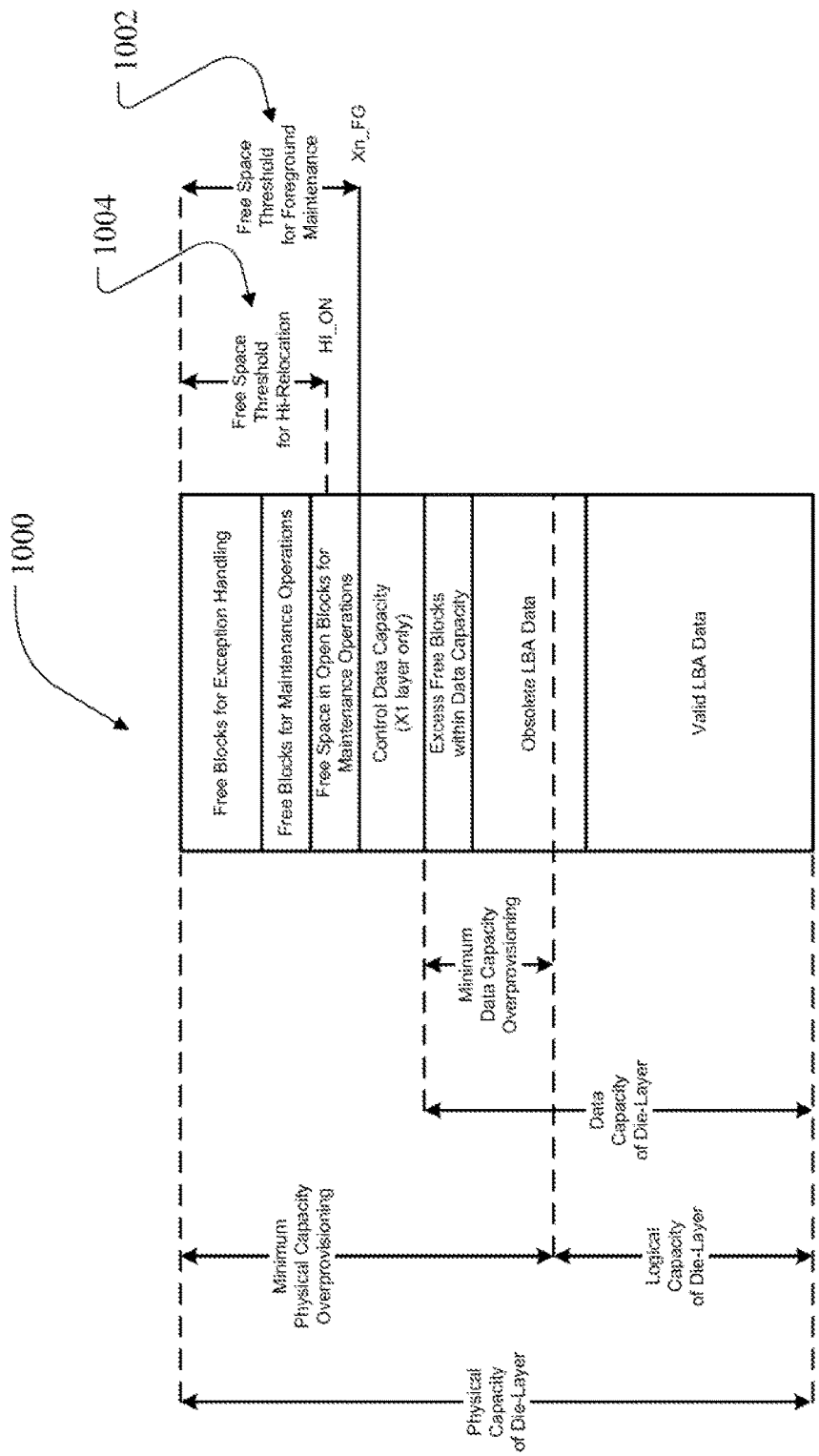
FIG. 10 is a more detailed die layer capacity distribution of the distribution shown in FIG. 9.

A more detailed data capacity distribution chart 1000 of the die layer data capacity chart of FIG. 9 is shown in FIG. 10. Free space is managed individually for each die layer by the data management module 112 of the controller 102. For each die layer, there is a free space threshold (Xn_FG) 1002 for initiating foreground maintenance operations. There may also be a free space threshold (HI_ON) 1004, representing less free space in the die layer than the standard foreground maintenance threshold 1002, at which point at higher relocation rate is needed to generate free space more quickly that the standard foreground maintenance threshold 1002. For both types of foreground maintenance operations, host data writes are interleaved with maintenance operations, but higher relocation rate maintenance threshold 1004 may include a higher ratio of maintenance to host write operations, for example by applying a predetermined multiplier to the regular schedule cycle such that a higher ratio of pages of maintenance data moves to host data writes is achieved.

In one implementation, the controller 102 maintains a guaranteed quantity of free space in a die layer of a given die by maintaining a guaranteed number of free blocks in the free block list 718 in the data management module 112 for temporary use in exception handling, as well as a guaranteed capacity of free space for use in maintenance operations, which may be defined in metapages. The free space of metapages guaranteed for maintenance operations may be in two categories: metapages in free blocks in the free block list for the die layer, for allocation as update blocks and relocation and fold destination blocks; and free space, i.e. unprogrammed metapages, in open blocks in the die layer.

Free space in a die layer does not change when a block is allocated from the free block list 718 as an update block or relocation or fold destination block. Free space in a die layer increases when a relocation or fold source block is returned to the free block list. Free space in a die layer decreases when data is programmed in any open block in the die layer. Free space in a die layer may have no cumulative change as a result of sustained operation with foreground maintenance. Free space in a die layer increases when background maintenance is performed. Free space in a die layer decreases when data is imported to the layer with no maintenance active.

Although multiple different die layer combinations are contemplated, where each die layer in a particular non-volatile memory die operates at a different bit per cell capacity, the following discussion focuses on two layer non-volatile memory die: a non-volatile memory die with an X1 and an X2 layer, herein referred to as an eX2 die, and a non-volatile memory die with an X1 and an X3 layer, herein referred to as an eX3 die. Also, in the discussion below it is assumed that the X1 die layer is made up of blocks that are dedicated to operating in X1 programming mode, and the MLC die layer (in other words the X2 or the X3 layer in this example) comprises blocks that are dedicated to operating in MLC programming mode. Blocks may not change type from X1 to MLC, and vice versa, in one embodiment, thus separate pools of free blocks exist for X1 and MLC use.

Foreground Maintenance Schedule Cycles

As noted previously, a predetermined amount of free blocks are typically required in order for a die to be able to operate within desired operating parameters. Each layer of a multi-layer non-volatile memory die, or of a metadie, may have different predetermined free block minimums defining the threshold 1002 at which a foreground maintenance operation is needed. When the number of free blocks in a destination layer of a die selected to receive a host data write is below the predetermined threshold for that layer, then a source block for a maintenance operation is selected in the destination layer and a foreground maintenance schedule cycle is set.

A foreground maintenance schedule cycle, also referred to herein as a schedule cycle or a maintenance cycle, is defined by the operations needed to free the selected source block. The valid data in the source block is moved, either relocated to another block in the same layer or folded into the next layer, and host data up to an amount equal to the difference between the amount of valid data in the selected source block and a full block may be written to an open write block in the layer. Thus, in one embodiment, a schedule cycle is based on freeing a selected source block rather than being dependent on completion of writing any specific amount of host data. The amount of host data permitted in a given schedule cycle will vary and is limited to whatever amount of space is left in a complete block after the valid data from the selected source block has been accounted for. For example, if a selected source block in a destination layer of a die has a capacity for 100 pages, and the amount of valid data to be moved out of the selected source block to free that block is 75 pages, then 25 pages worth of host data may be written in the schedule cycle calculated for that selected source block. Continuing with this example of blocks having a capacity for 100 pages, if the next selected source block in a destination die layer has only 25 pages of valid data, then the amount of host data that may be interleaved with the 25 pages of the maintenance operation to free that next source block would be 75 pages. The valid data from the selected source block may be written to one or more destination blocks that differ from the one or more host data write blocks receiving the host data that is permitted during the schedule cycle.

Each schedule cycle has its own interleave ratio of maintenance data writes to host data writes that is calculated. The interleave ratio is based on a presumption that the amount of permitted host data will be available during the schedule cycle, but actual receipt of the amount of host data assumed to be available when the interleave ratio is determined at the beginning of the schedule cycle is not necessary. Instead, the schedule cycle may proceed even if the maximum permissible host data does not arrive so that at least the selected source block is freed.

Host Data Write Operations

A current host data write operation is initiated when a host data write transaction has been constructed from entries in the command cache 702 of the data management module 112 and the previous host data transaction has been posted to a die transaction queue 732. The die to which data corresponding to a current host data write transaction will be written may be selected independently for each individual transaction to optimize data throughput. Accordingly, there may be no predetermined order of die selected for successive transactions in one embodiment. In one implementation, die selection is made by maximizing the number of die that are concurrently busy at any time, which may be achieved by keeping the die transaction queue 732 for each die loaded at all times, as far as is possible.

Figure 11:
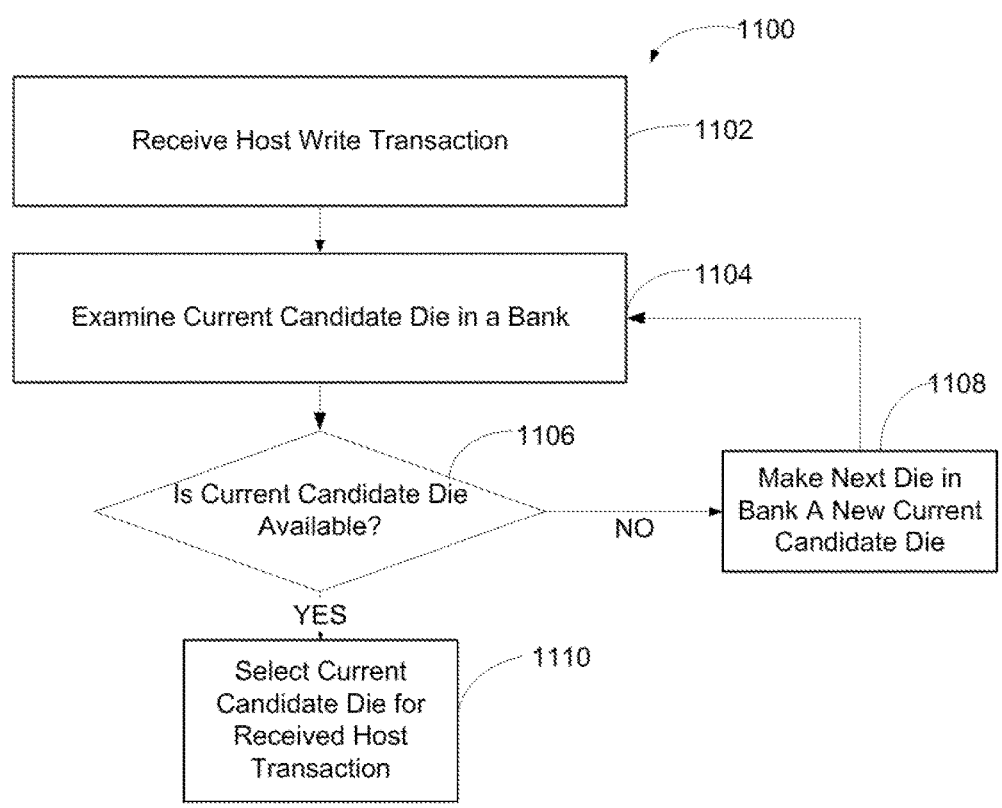
FIG. 11 is a flow diagram showing an example non-volatile memory die selection process in a bank of a non-volatile memory array such as shown in FIG. 6.

One example of a die selection process 1100 is illustrated in FIG. 11. After receiving a host write instruction, a bank 604 of non-volatile memory die is selected by the data management module 112 for the transaction (at 1102). The non-volatile memory die selection within the bank 604 for receiving data for a current host write transaction may be accomplished using a continuous round robin process. A current candidate die in the bank 604 is examined and reviewed to see if that die is available for the write transaction (at 1104, 1106). If the current die in the round robin review is unavailable then a next die is selected as the current candidate die and examined (at 1106, 1108). Once a current candidate is found to be available, that die is selected for receiving the write transaction (at 1110). In one embodiment, the availability of a die may be determined by whether the number of queued write transactions in its die transaction queue 732 is less than a maximum limit and whether the die has any pending read or write transactions for maintenance which are associated with the previous host write transaction to the die and which have not yet been loaded to its die transaction queue 732. If all die in the bank 604 have been evaluated as candidates and are not available, then the data management module 112 of the controller 102 may wait for the first die to become available in the bank and select it for the current host write transaction.

Programming Data Flows within a Die

For the maintenance scheduling techniques described, data flow between non-volatile memory blocks and between volatile memory, such as RAM, and a non-volatile memory block is managed independently within the selected single non-volatile memory die. Different data flow structures may be used based on the type of non-volatile memory die. eX2 and eX3 die examples are illustrated in FIGS. 12 (eX2) and 13 (eX3), where the eX2 and eX3 example architectures are specific examples of the general multi-layer non-volatile memory die 104 discussed with respect to FIG. 5A.

Figure 12:
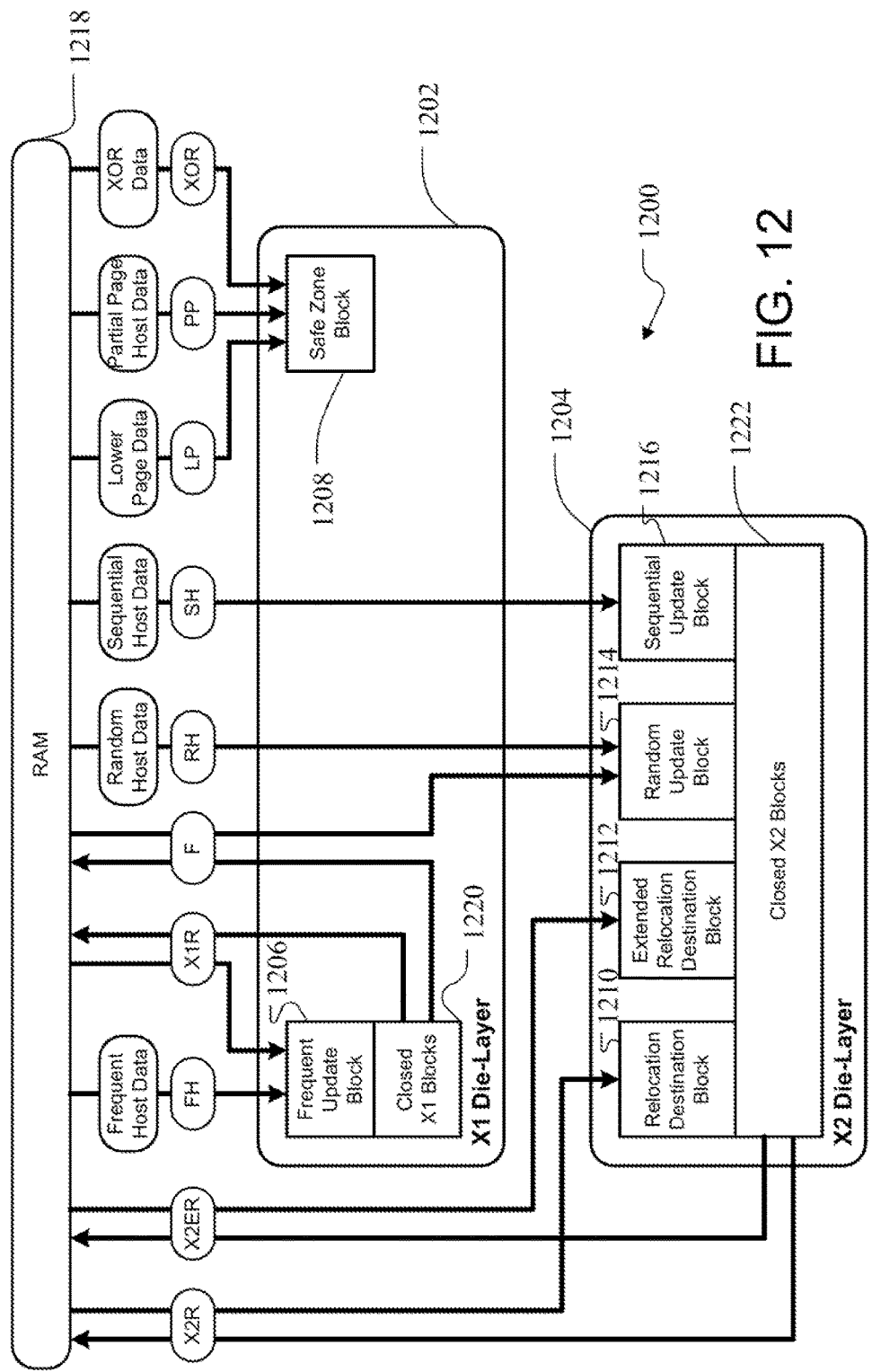
FIG. 12 illustrates an example block and data path arrangement in a non-volatile memory die having one bit per cell and two bit per cell die layers.

Referring to FIG. 12, a detailed view of an exemplary eX2 die 1200 is shown having six blocks concurrently open in the X1 and X2 layers of the die. In this implementation, an open frequent update block 1206 and an open safe zone block 1208 may be maintained on the X1 die layer, while a random update block 1210, sequential update block 1212, relocation destination block 1214 and an extended relocation block 1216 may be open on the X2 die layer 1204 of the eX2 die.

In the X1 die layer 1202, the frequent update block 1206 may be used for receiving data associated with frequently updated logical block addresses (LBAs) from the host and as the destination for data relocation within the X1 layer 1202. In one implementation, a frequent write transaction has a length of one die-page, which comprises two or more runs of contiguous LBA addresses. The safe zone block 1208 in the X1 die layer 1202 may be used for buffering data in response to a flush cache command from the host to protect against loss of data in the event of a subsequent loss of power. Buffered data in the safe zone block 1208 may be partial page data from the host or exposed host data in an X2 lower page. In addition, multiple pages of exclusive-or (XOR) data may be buffered in the safe zone block 1208 following power off notification in the form of a standby immediate command from the host. Data in the safe zone block is only used following an exception condition. In one implementation, the safe zone block 1208 acts as a temporary buffer only, and is not used as a source block for a maintenance operation. Data may be written to the safe zone block without a maintenance schedule.

Regarding the four open block types illustrated in the X2 die layer 1204 of the example eX2 die 1200 in FIG. 12, the random update block 1214 may be used for writing random data from the host and as the fold destination block for data being folded from the X1 die layer 1202. In one implementation, a random write transaction has a length of one die-page, which comprises two or more runs of contiguous LBA addresses. The sequential update block 1216 may be used for storing sequential data from the host. A sequential write transaction is defined herein as a host data write having a length of one die-page, which comprises a single run of contiguous LBA addresses. The relocation destination block 1210 may be used for data being relocated within the X2 die layer 1204. A relocation transaction may have a length of one die-page and may comprise one or more runs of contiguous LBA addresses. Finally the extended relocation destination block 1212 may be used for data being relocated within the X2 die layer 1204 as part of an extended relocation operation. An extended relocation operation is described in greater detail below. An extended relocation transaction may have a length of one die-page and may comprise one or more runs of contiguous LBA addresses.

As shown in FIG. 12, there are several data flow paths that may be used in an eX2 die depending on the source and type of the data involved. Host data for frequently updated LBAs (also referred to as FH data) may be programmed from a buffer in the general memory pool in RAM 1218 to the frequent update block in X1. A write transaction of FH data consists of a full die-page in one implementation. Any of a number of mechanisms for identifying host data as FH data may be implemented, such as examining the write command for hints or flags provided by a host as to the data type, or the controller 102 examining the file type suffix of the data (for example, .tmp, .pdf and so on) and comparing the host hint or file type suffix to a predetermined data type table. Other mechanisms or techniques for determining the appropriate data type, whether the FH type data or any of the other data types noted below, may be used.

Host data designated as random host data, or RH data, may be programmed in increments of a die page from the RAM 1218 to the random update block 1214 in the X2 die layer 1204 as shown. Similarly host data designated as sequential host data, or SH data, may be programmed in increments of a die page from the RAM 1218 to the sequential update block 1216 in the X2 die layer 1204. Separately, partial page host data, exposed lower page data and certain pages of XOR data (also referred to as PP, LP and XOR data, respectively) may be programmed into the safe zone block 1208 in the X1 die layer 1202 in certain circumstances. For example, PP data existing in the general memory pool in RAM 1218 may be programmed to the safe zone block 1208 in X1 1202 following a specific host command such as a flush cache command or a standby immediate command. A write transaction of PP data may consist of a partial die-page, which may be a multiple of 4 kilobytes (KB) in one implementation. In like manner, any exposed lower pages of host data already programmed in X2 1204, whose corresponding upper pages have not been programmed, are programmed to the safe zone block 1208 in X1 in response to a specific host command such as a flush cache command or a standby immediate command, to protect against loss of data in the event of a subsequent loss of power. Two pages of XOR data per open X1 block and four pages of XOR data per open X2 block may be programmed to the X1 safe zone block 1208 in response to a standby immediate command, to protect against loss of data in the event of a subsequent loss of power.

The data path for valid data from previously fully programmed blocks, previously fully programmed blocks also referred to herein as closed blocks, depends on the type of maintenance operation that is triggered. When valid data from a closed block is moved in a maintenance operation, the closed block selected for the maintenance operation is referred to as a source block. Source blocks may be selected from closed X1 blocks 1220 or closed X2 blocks 1222. The die layer location of the closed block and the status of the die layer may be used in determining the data path that the valid data for the source block takes. Valid data from a closed X1 block 1220 may be relocated to the frequent update block 1206 in the X1 layer 1202. In such a relocation operation, data from one or more die pages, also referred to as X1 R data, in one closed X1 block 1220 is relocated via the RAM 1218 to the frequent update block in X1 1202. A single copy operation comprises one die-page to be programmed. Alternatively, data from the closed X1 block 1220 may be moved from X1 1202 into the X2 layer 1204 in a fold operation. Data to be folded from X1 to X 2, also referred to as F data, may be taken from one or more die-pages in one closed X1 block 1220 for folding via RAM 1218 to the random update block 1214 in X2. Finally, maintenance operations in the X2 layer 1204 may consist of relocating data from one or more die-pages in one closed X2 block 1222 via RAM 1218 to the relocation destination block 1210 in X 2.

Figure 13:
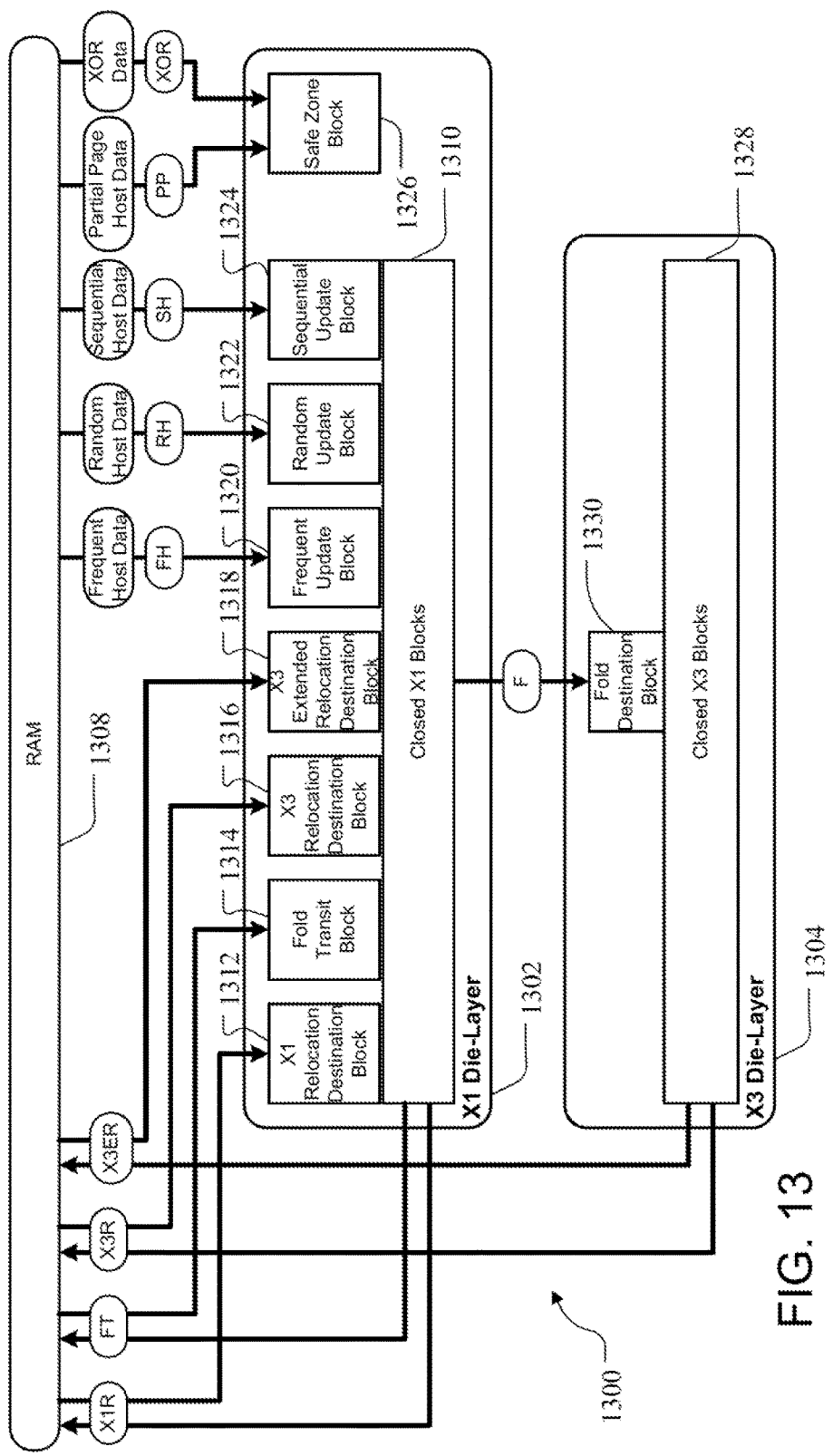
FIG. 13 illustrates an example block and data path arrangement in a non-volatile memory die having one bit per cell and three bit per cell die layers.

An example eX3 die 1300, having X1 1302 and X3 1304 layers, is shown in FIG. 13. In this embodiment, only a single open block is positioned on the X3 layer 1304. The single open block is designated as a fold destination block 1306. Unlike the eX2 die example discussed above, the mechanism for writing into the X3 layer 1304 of the eX3 die 1300 is by a fold operation and no direct data paths from the host, via the RAM 1308, are contemplated in one implementation. Additionally, the fold operation from X1 to X3 is carried out as an on-chip copy operation where data from closed X1 blocks 1310 is copied directly to the X3 layer 1304 without passing the data through the RAM 1308.

In order to accomplish the data path arrangement illustrated in FIG. 13, there may be nine open write blocks on the eX3 die 1300, with only one of those open blocks, the fold destination block 1306, being on the X3 layer 1304. An X1 relocation destination block 1312 for relocating data from closed X1 blocks 1310, as well as an X3 relocation destination block 1316 for relocating data from closed X3 blocks, are located in the X1 layer 1302. The X3 relocation destination block 1316 is used as an intermediate destination for data being relocated from selected closed X3 blocks 1328 via the X1 die layer 1302 to the fold destination block 1330. A relocation transaction has a length of one die-page and may comprise one or more runs of contiguous LBA addresses.

In the implementation of an eX3 die 1300 shown in FIG. 13, a frequent update block 1320, random update block 1322 and sequential update block 1324 are also located in the X1 layer 1302. A safe zone block 1326 is located in the X1 layer 1302, however, unlike the safe zone block in the eX2 die, no data path for lower page information is needed because any writing to X3 in this embodiment only occurs via an on-chip copy process and thus there is no lower page data passed through RAM 1308 to be stored in the safe zone block 1326 as in the example eX2 die of FIG. 12. The safe zone block 1326 acts as a temporary buffer only, and is not used as a source block for a maintenance operation. Data may be written to the safe zone block without a maintenance schedule. Finally, in addition to an X3 extended relocation destination block 1318, a fold transit block 1314 is present in the X1 layer 1302. The fold transit block 1314 may be used an intermediate destination for data being relocated within the X1 die layer 1302 via the RAM 1308, prior to being folded to the X3 die layer 1304 in an on-chip copy operation. A relocation transaction may have a length of one die-page and may comprise one or more runs of contiguous LBA addresses.

The data flow paths in an eX3 die 1300 with X3 programming via on-chip copy from X1 1302, as shown in FIG. 13 and described below, relate to data write and copy transactions within the data management module or media management layer module. The process of folding data from the X1 layer 1302 to X3 layer 1304 includes multiple transfers of each page of data within a three pass programming process referred to as a first/foggy/fine programming sequence. These multiple transfers are managed by lower level firmware layers, such as by sequencer 126, and are invisible to the data management and media management layer modules. In one implementation, the on-chip copy is executed by reading the data from the X1 die layer into a set of internal latches 157 of the die 104 (See FIG. 2B) containing the die layer 1304 and then copying the data from the internal latches 157 into the X3 die layer without reading the data off of the non-volatile memory die 104.

Referring to the example data path designations of FIG. 13, the FH data path is for host data for frequently updated LBAs that is programmed from a buffer in the general memory pool in RAM 1308 to the frequent update block 1320 in X1 1302. A write transaction comprises a full die-page. Any of a number of known mechanisms for identifying frequently updated data, whether from express data type information provided from the host or characteristics about the data determined by the memory system. The RH data path is the path where one die-page of random host data is programmed from the general memory pool in RAM 1308 to the random update block 1322 in X1 1302. The SH data path illustrates where one die-page of sequential host data is programmed from the general memory pool in RAM 1308 to the sequential update block 1324 in the X1 die layer 1302.

In contrast, the PP data path shows where partial die-pages of host data existing in the general memory pool in RAM 1308 are programmed to the safe zone block 1326 in X1 1302 following a special host command, such as a flush cache command or a standby immediate command from the host. A write transaction over the PP data path may comprise a partial die-page, which may be a multiple of 4 KB in one implementation. The XOR data path, in the eX3 die embodiment, represents the path for two pages of XOR data per open X1 block and six pages of XOR data per open X3 block that may be programmed to the X1 safe zone block 1326 in response to a standby immediate command, to protect against loss of data in the event of a subsequent loss of power. The X1 R data path illustrates where data from one or more die-pages in one closed X1 block 1310 is relocated via RAM 1308 to the relocation destination block 1312 in X1 1302. A single copy operation along the X1 R data path comprises one die-page to be programmed.

The fold or F data path is the path where data from a set of 3 closed X1 blocks 1310 are folded via on-chip copy, and thus without passing through the RAM 1308 and the ECC processing of the controller 102, to the fold destination block 1330 in X3 1304. A single copy operation comprises one die-page to be programmed. In one embodiment, the set of three closed X1 blocks are the same type (i.e. all 3 X1 blocks are only one the different open block types discussed above). The X3 R data path shows where data from one or more die-pages in a closed X3 block 1328 is relocated via RAM 1308 to the X3 relocation destination block 1316 in X1 1302, as an intermediate step in X3 to X3 relocation. A single copy operation comprises one die-page to be programmed. Data from one or more die-pages in a closed X3 block 1328 is relocated via RAM 1308 to the extended relocation destination block 1318 in X1 along the X3 ER data path, as an intermediate step in X3 to X3 extended relocation. A single copy operation comprises one die-page to be programmed.

There may be instances when the controller 102 determines that a closed X1 block contains too much obsolete data to be folded into the X3 layer, the controller may initiate a fold transit (FT) data path operation. For example, if the predetermined threshold for the maximum amount of obsolete data is set to 40% obsolete data, then the controller may direct a closed X1 block containing more than 40% obsolete data to the FT operation before allowing that block to be among those folded into the X3 layer during a fold operation. In the FT operation, data from one or more die-pages in a closed X1 block 1310 is relocated via RAM 1308 to the fold transit block 1314 in X1 1302 along the FT data path and the source block is then put back into the available block pool in the X1 layer. In one embodiment, relocation of X3 data into another X3 block first involves copying the valid data from the source X3 block to an appropriate one or more X1 blocks in the X1 layer and then folding the data from 3 closed X1 blocks back into the X3 layer in an on-chip copy operation that does not pass the data through RAM 308.

Because the on-chip copy used for folding from X1 to X3 layers involves the controller 102 causing data to be folded to X3 to be copied into the latches 157 of the data cache of the die 104, and does not take the data off-chip via the RAM 116, the data does not pass through the controller ECC engine and a new ECC is not calculated for the data being folded. In order to preserve the originally calculated ECC for the page, the entire page should be copied so that the ECC for the page that was previously calculated when the data was written into the X1 die layer may be copied with the data into the X3 die layer. Also, in embodiments of the non-volatile memory system 100 where both ECC data is calculated for individual pages to allow for error correction of the individual pages, and parity bits (such as exclusive or (XOR) parity) are calculated for blocks of pages to allow for error correction on the block level, then an entire block of X1 data may be folded using the on-chip copy process so that both the ECC data and the parity data may be carried over from the X1 layer to the X3 layer.

Selecting the Schedule Type

Figure 14:
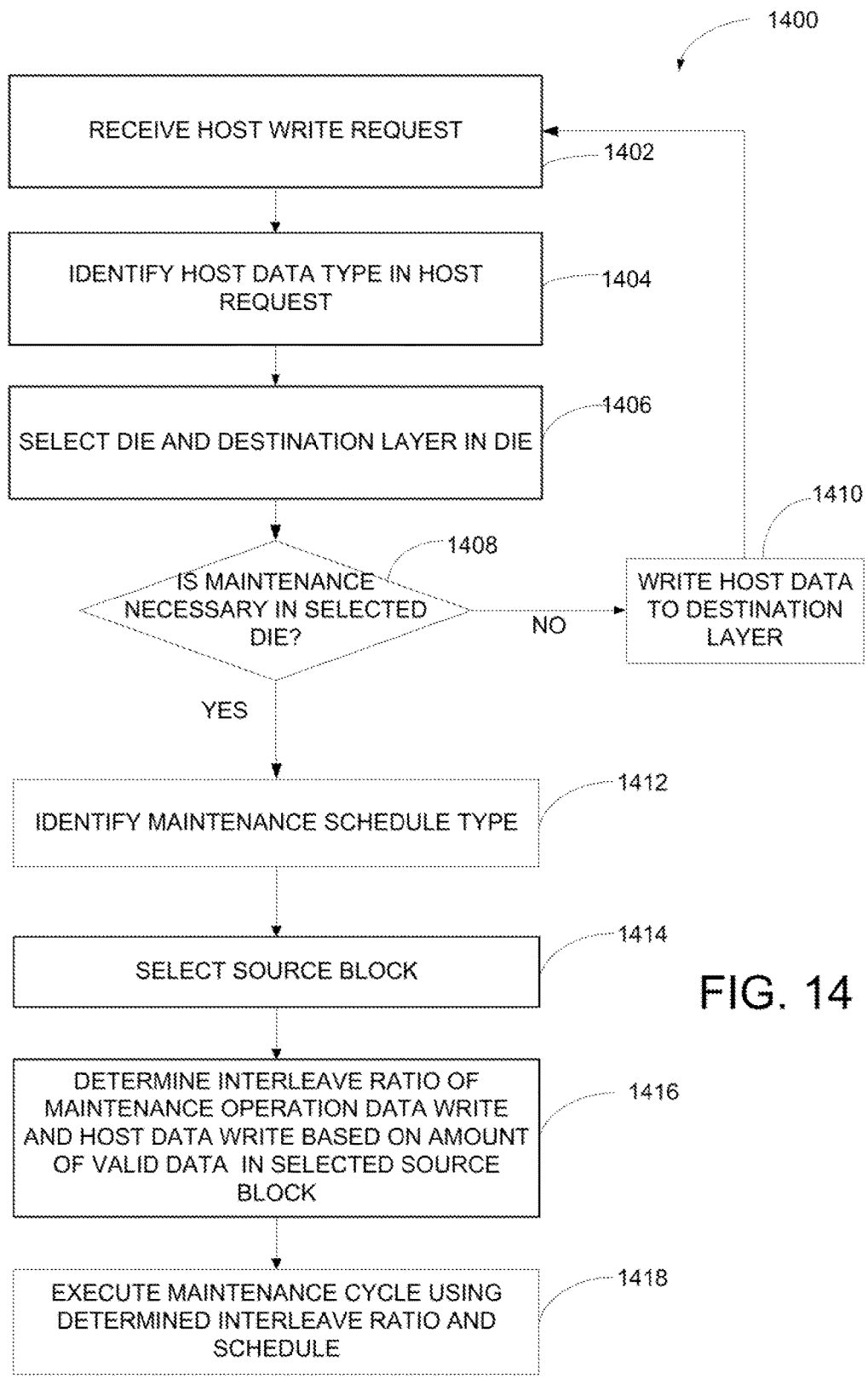
FIG. 14 is a flow diagram of an embodiment of a schedule cycle generation and execution process in a non-volatile memory system.

Referring to FIG. 14, an implementation of the overall process of determining and executing an interleaved foreground schedule cycle is illustrated. Each schedule cycle determined by the process includes a maintenance operation and a host write operation. The maintenance operation is selected first and will be sufficient to free one source block. The amount of host write data to be completed in the schedule cycle will depend on the amount of valid data that needs to be moved to free the selected source block. More specifically, the maximum amount of host data that may be written in the schedule cycle is no more than the difference between the amount of valid data that needs to be moved from the selected source block to free the selected source block and the total data capacity of the source block.

When a host command, such as a write command, is received at the memory system, the data management module 112 caches the command in the command cache 702 and caches data associated with the command in a buffer memory that may be part of the RAM 116 of the non-volatile memory system 100. Host commands are queued until sufficient data is received in the RAM to satisfy the data transaction size supported by the memory system 100. For example, the transaction size for a data write may be 32 kilobytes (Kbytes) of data, which may be the page size used in the memory system. The amount of data associated with a command may vary, typically anywhere from a minimum of a single cluster to some large integer multiple of clusters. A typical cluster size may be 4 Kbyte, but this size may differ in different memory systems. If or when the non-volatile memory system 100 has sufficient buffer space to cache all data for a particular command, it may request all of the data for the command to be transferred by the host. The data programmed into non-volatile memory from the buffer memory is generally programmed in the order received, but this need not be the case. Thus, the data programmed in a given 32 Kbyte write transaction from the buffer memory to non-volatile memory may relate to multiple host commands.

Once an amount of data sufficient to satisfy the data transaction size for programming the non-volatile memory is received and selected for a write transaction, in this example 32 Kbytes of data, the command or commands to which the data in the write transaction relates become qualified command(s). The transaction router 704 of the data management module 112 may then determine which non-volatile memory die to use and trigger the maintenance manager 720 to begin a foreground maintenance cycle for each qualified command. Later received host commands in the command cache 702 may be acted on first if data has not yet been received in RAM for an earlier received command. The transaction size noted above is provided by way of example and any of a number of transaction sizes, larger or smaller than 32 Kbytes, may be used in different implementations.

When all data for a particular host command has been programmed in non-volatile memory in one or more transactions, the non-volatile memory system 100 may signal to the host that the particular command is complete (if write caching is disabled). Alternatively, if write caching in a RAM buffer is enabled, a command may be considered complete when all data for the command has been programmed into RAM and a command completion message can be signaled to the host. The non-volatile memory system 100 provides status to the host to indicate when it can receive a new command. If device status allows, the host may send a new command to the device. For example, if the Native Command Queue protocol is being used, the non-volatile memory system 100 may be allowed to have a maximum of 32 uncompleted commands in its queue.

As shown in FIG. 14, after receiving a host write command and accumulating enough data to satisfy the memory system transaction size requirement, the maintenance manager 720 may identify the host data type (at 1402, 1404). The host data types include frequently updated host data, random host data, and sequential host data in the example multi-layer non-volatile memory die examples of FIGS. 12 and 13. Other predetermined data types may be utilized and identified in other implementations. The transaction router 704 of the data management module 112 may select a die and destination layer to handle the write operation (at 1406). The selection of the die may be according to the process described in FIG. 11, where a particular bank 604 is first determined by, for example, the LBA range of the data in the write command and then a round robin selection may be made to find an available die in the bank. The destination layer will depend on the type of data identified and the predetermined data path for that data such as illustrated in the example eX2 die 1200 and eX3 die 1300 in FIGS. 12 and 13. If the selected die and die layer have a number of free blocks above the predetermined threshold number of free blocks for that die layer, then the host data may be written to the destination layer in the selected die without the need for any foreground maintenance operations (at 1408, 1410).

Alternatively, if the selected die and layer need a maintenance operation in order to maintain an amount of free blocks greater than the predetermined threshold for foreground maintenance for that die layer, then the type of schedule needed to accommodate data of the identified data type in that die layer is identified (at 1408, 1412). The type of schedule necessary will depend on the status of the selected die. The status of a selected non-volatile memory die and the predetermined types of schedules available for that nonvolatile memory die may vary depending on the type of non-volatile memory die. In the discussion below, die status and schedule types are discussed for the example eX2 and eX3 die types discussed above.

Once the host data type is identified, the status of the selected die is determined and one of a predetermined number of schedule types of host data programming and maintenance operations is selected based on the die status, then a source block or blocks for any predetermined maintenance operations dictated by the selected schedule type is selected (at 1414). When the source block(s) for carrying out any maintenance operations are selected, then the maximum number of host data pages can be calculated and the interleaving of maintenance operations to host data write operations needed to complete the selected schedule cycle type may be calculated (at 1416). The schedule cycle is then carried out using the determined interleave ratio (or, as described in greater detail below for non-integer ratios, the set of interleave ratios needed to achieve the overall calculated interleave ratio) for that cycle (at 1418). Each cycle consists of the maintenance operations needed to free the selected source block and consume no more capacity in that die layer of the selected die than a capacity of one block. The schedule cycle process 1400 of FIG. 14 is repeated as necessary to maintain a balance of freeing and consuming free space when the amount of free space in a layer of a selected non-volatile memory die is below a predetermined threshold amount. In alternative embodiments, an extended maintenance schedule for handling maintenance operations dictated by other than free space and valid data capacities (e.g. maintenance on blocks requested by wear leveling algorithms in the memory system) may be interleaved with the program scheduling discussed in FIG. 14. Extended maintenance operations are discussed separately below With respect to the eX2 die example of FIG. 12, one example of possible die states and the resulting schedule types are illustrated in Tables 1 and 2.

TABLE 1

| Schedule Type | Host Data Input Layer | Host Data Path | Maintenance Operations | Maintenance Data Path |
|---|---|---|---|---|
| S1 | X1 | FH | None | — |
| S2 | X1 | FH | X1→X1 relocation | X1R |
| S3 | X1 | FH | X1→X2 fold | F |
| S4 | X1 | FH | X1→X2 fold & X2→X2 relocation | F & X2R |
| S5 | X2 | RH/SH | None | — |
| S6 | X2 | RH/SH | X2→X2 relocation | X2R |

Table 1 shows an example of 6 different schedule types (S1-S6) supported by the eX2 die of FIG. 12. Schedule types S1 to S4 relate to host data programming in the X1 die layer, and S5 and S6 relate to host data programming in X2 die layer. Referring to Table 2, the state of an eX2 die (DIE_STATE) is a function of the amount of valid data and free space in die layers and of the non-volatile memory die in which host data is to be written, and determines the schedule type that is selected for maintenance operations from Table 1.

TABLE 2

| | | DIE_STATE | | |
|---|---|---|---|---|
| Schedule Type | Host Data Input Layer | X1_Free_Space ≤ X1_FG | X1_Valid_Data ≥ X1_FOLD | X2_Free_Space ≤ X2_FG |
| S1 | X1 | No | x | x |
| S2 | X1 | Yes | No | x |
| S3 | X1 | Yes | Yes | No |
| S4 | X1 | Yes | Yes | Yes |
| S5 | X2 | x | x | No |
| S6 | X2 | x | x | Yes |

As seen in Table 2, a number of parameters define the state of an eX2 die. These include the die layer in which host data should be written. This is determined by the type of data and the available data path for that type of data as shown in FIG. 12. Other parameters may include a comparison of the quantity of free space in the X1 die layer (X1_Free_Space) relative to the trigger threshold for foreground maintenance in X1 (X1_FG), a comparison of the quantity of valid data in the X1 die layer (X1_Valid_Data) relative to the trigger threshold for folding from X1 to X2 layers in a particular non-volatile memory die (X1_Fold), and a comparison of the quantity of free space in the X2 die layer (X2_Free_Space) relative to the trigger threshold for foreground maintenance in X2 (X2_FG). The thresholds for X1_FG, X1_Fold and X2_FG may be predetermined fixed numbers of free pages stored in the non-volatile memory at the time of manufacture, or may be variable based on other criteria. Each of the threshold comparisons may be carried out by the die manager in the data management module associated with the selected die. Once the die status is determined based on the parameters shown in Table 2, then the schedule type is identified and the appropriate host data path and maintenance data path for the selected die may be determined from a data structure such as shown in Table 1. If the current state of the non-volatile memory die is such that foreground maintenance operations are on, then the re-evaluation of the amount of free space may only be made after a current maintenance cycle is completed. If the foreground maintenance operations are currently off, then the free space analysis for determining whether to turn on foreground maintenance may be executed after execution of every write transaction (e.g. after every 32 kbyte of data (or page of data) is written).

After identifying the schedule type, if a maintenance operation is needed (in this example, other than an S1 or S5 schedule type where no maintenance is needed) then a source block is selected for the maintenance operation associated with the identified schedule type (See FIG. 14, step 1414). The source block for any maintenance operation associated with the identified schedule type will be chosen in the die layer identified in the schedule table in Table 1. In the example eX2 die arrangement of Table 1, for schedule types S2 and S3, a source block is selected from the closed blocks in the X1 die layer. For schedule type S4, both X1 and X2 source blocks are selected, where the X1 source block is selected for the X1 to X2 fold portion of the maintenance and the X2 source block is selected for the X2 relocation portion of the S4 schedule type. Finally, for the S6 schedule type, an X2 source block is selected. In one embodiment, for schedule types that involve a relocation within the same die layer, the source relocation block selected is the closed block in that die layer having the lowest amount of valid data. For fold operations from X1 to X2 (e.g., in the S3 and S4 schedule types of Table 1), the source fold block selected in the X1 die layer may be the oldest single closed block of host data in the X1 die layer.

With respect to the eX3 die example of FIG. 13, one example of possible die states and the resulting schedule types are illustrated in Tables 3 and 4. The eX3 die states and schedule types are similar to those of the eX2 example above, but differ due to the different open block structure shown in the example eX3 die of FIG. 13, where there is only a single open block in the X3 die layer of an eX3 non-volatile memory die 1300 at any given time.

TABLE 3

| Schedule Type | Host Data Input Layer | Host Data Path | Maintenance Operations | Maintenance Data Path |
|---|---|---|---|---|
| S1 | X1 | FH/RH/SH | None | — |
| S2 | X1 | FH/RH/SH | X1→X1 relocation | X1R |
| S3 | X1 | FH/RH/SH | X1→X3 fold | F |
| S4 | X1 | FH/RH/SH | X1→X1 transit relocation | FT |
| S5 | X1 | FH/RH/SH | X1→X3 fold & X3→X1 relocation | F & X3R |

Table 3 shows an example of 5 different schedule types (S1-S5) supported by the eX3 die of FIG. 13. Because all data paths for initial host data writes are directed to the X1 layer 1302 of the eX3 non-volatile memory die 1300 in this embodiment, all schedule types only include host data programming in the X1 die layer 1302. Referring to Table 4, the state (DIE_STATE) of an eX3 die is a function of the amount of valid data and free space in die layers and of the non-volatile memory die in which host data is to be written, and determines the schedule type that is selected for maintenance operations from Table 3.

TABLE 4

| | DIE_STATE | | | |
|---|---|---|---|---|
| Schedule Type | X1_Free_Space ≤ X1_FG | X1_Valid_Data ≥ X1_FOLD | Block_Valid < X1_TRANSIT | X3_Free_Space ≤ X3_FG |
| S1 | No | x | x | x |
| S2 | Yes | No | x | x |
| S3 | Yes | Yes | No | No |
| S4 | Yes | Yes | Yes | x |
| S5 | Yes | Yes | No | Yes |

As seen in Table 4, a number of parameters define the state of an eX3 die is greater than the number of parameters in the prior eX2 example. The parameters may include a comparison of the quantity of free space in the X1 die layer (X1_Free_Space) relative to the trigger threshold for foreground maintenance in X1 (X1_FG) and a comparison of the quantity of valid data in the X1 die layer (X1_Valid_Data) relative to the trigger threshold for folding from X1 to X3 (X1_Fold). The parameters may also include a comparison of the quantity of valid data in a block selected for folding to X3 (Block Valid) relative to the trigger threshold for data transit in X1 (X1_Transit) and a comparison of the quantity of free space in the X3 die layer (X3_Free_Space) relative to the trigger threshold for foreground maintenance in X3 (X3_FG). The thresholds for X1_FG, X1_Fold, X1_Transit and X3_FG may be fixed numbers of free blocks stored in the non-volatile memory at the time of manufacture, or may be variable based on other parameters. Each of the comparisons may be carried out by the die manager of the data management module 112 associated with the selected die. Once the die status is determined based on the parameters shown in Table 4, then the schedule type is identified and the maintenance data path for the selected die may be determined from a data structure such as shown in Table 3.

After identifying the schedule type, if a maintenance operation is needed (in this example, other than an S1 schedule type where no maintenance is needed) then a source block is selected for the maintenance operation associated with the identified schedule type (See FIG. 14, step 1414). The source block for any maintenance operation associated with the identified schedule type will be chosen in the die layer identified in the schedule table in Table 3. In the example eX3 die schedule type arrangement of Table 3, for schedule types S2-S4, a source block is selected from the closed blocks in the X1 die layer.

An S4 schedule cycle causes valid data in an X1 block containing a required fraction of obsolete data to be compacted by relocating it to one or two transit destination blocks 1314 in X1 1302. An S4 schedule cycle may be initiated as an alternative to an S5 schedule cycle if evaluation of DIE_STATE shows that the block that would be selected as fold source block in X1 for an S5 schedule cycle has valid data content below the trigger threshold for X1 block transit (X1_TRANSIT).

For schedule type S5, both X1 and X3 source blocks are selected, where the X1 source block is selected for the X1 to X3 fold portion of the maintenance and the X3 source block is selected for the X3 relocation portion of the maintenance. In one embodiment, for schedule types that involve data relocation within the same die layer, the source relocation block selected is the closed block in that die layer having the lowest amount of valid data. For fold operations from X1 to X3, the three source fold blocks selected in the X1 die layer may be the oldest three blocks of the same data type (e.g. random (RH), sequential (SH), etc.) of host data in the X1 die layer. For the host write operation portion of a given schedule cycle in the example eX3 die, the host data may be any combination of different data types, such as SH, RH or FH, which is written to corresponding different open update blocks in the X1 layer.

In one embodiment, an X3 fold destination block 1330 is programmed in full with a single type of data, which may be a combination of valid and obsolete data. Data types may be sequential data, defined as data in an X1 block which was written as a sequential update block (SH) or random data, defined as data in an X1 block 1310 which was written as a random update block, frequent update block, X1 relocation destination block, or fold transit block. In one implementation, data of a single type to be folded to an X3 fold destination block 1330 must be present in exactly three closed X1 fold source blocks at the start of a schedule cycle. The data may have been written to the X1 blocks 1310 at any time prior to the current schedule cycle. In one implementation, the priority order for selection of a set of three X1 blocks to be folded to an X3 fold destination block 1330 may be first transit blocks containing host data which has been relocated from X1 1302, followed by selection of any other blocks. The same priority may apply to blocks containing sequential data and blocks containing random data. The choice between sequential and random blocks may be made according to the data type in the oldest single block of host data.

In an S5 schedule cycle for the eX3 non-volatile memory die 1300 example, the cycle may have a length defined by the programming of a single X3 fold destination block. One X3 relocation source block is selected at the start of each schedule cycle, and all valid data in the block is relocated to multiple X3 relocation destination blocks 1316 in X1 1302 within the schedule cycle. Relocated data with all original data types may be programmed in the same X3 relocation destination block 1316. A volume of host data equal to the difference between the X3 block size and the volume of relocated data may be programmed in X1 update blocks within a schedule cycle.

Once the schedule cycle type has been identified for a die, an interleave cycle of the host data write operation and any maintenance operation associated with the identified schedule cycle type (e.g. one of S1-S6 shown in Table 4 for the example eX2 die of FIG. 12, or one of S1-S5 shown in Table 3 for the example eX3 die of FIG. 13) is determined. For those cycle types identified with no maintenance operation needed, such as the eX2 S1 or S5 schedule types, only the host data is written and thus no interleave is needed. For those schedule types that do identify maintenance operations on one or more die layers of the selected die, then the interleave cycles for interleaving host data writes with any maintenance operation reads and writes are determined. The data management module 112, for example via the program interleaving module 730 of the appropriate die manager 706 in the data management module 112, may make the interleave cycle and interleaving determination. In one implementation, an interleave cycle is a minimum sized set of programming and read operations, which performs the basic unit of program interleaving within a schedule cycle. Given that the number of pages of maintenance reads and writes can differ from schedule cycle to schedule cycle depending on the amount of valid data present in a selected source block, and because there may not be any one type of interleave cycle that the host and maintenance data divides evenly into, it is expected that multiple types of interleave cycles will normally exist within a schedule cycle.

Referring again to FIG. 14, the selection of the source block for a maintenance operation (see step 1414) will depend on the maintenance operation(s) called out by the determined schedule type. For relocation operations within a layer, selecting a source block may be accomplished using any of a number of single or combined criteria. In one embodiment, the closed block containing the least amount of valid data may be selected as the source block. The type of data in the selected relocation source block may be of a type compatible with the current schedule. Although closed blocks selected as source blocks for a relocation operation typically have a mix of valid and obsolete data, a block containing zero valid data is permitted as the selected relocation source block. In this case, the block would be immediately added to the free block list for the layer in the die. Another relocation source block need not be selected until the next schedule cycle is determined. The relocation destination block that will receive the valid data from the relocation source block may be selected from the head of the free block list for the layer when a previous relocation destination block in the die layer has become full. In one implementation, the selected relocation destination block remains the only relocation destination block in the die layer until that selected relocation block becomes full. An open relocation destination block may remain dormant if relocation in the die layer is not required in a current schedule. Data may be relocated from a relocation source block in physical page address order, irrespective of the LBAs of the data being relocated. In one implementation, sufficient read operations are performed on valid data in the relocation source block, and sufficient data transferred to RAM 1218, 1308 to create at least one die page of consolidated data in RAM for programming to the relocation destination block.

Selection criteria for a source block may differ from the criteria noted above when the maintenance operation is for a folding operation rather than a relocation operation. A folding operation causes valid data to be copied from one or more selected source blocks in a die layer to an open block within a different die layer. Data folding from a source die layer to a destination die layer is triggered in accordance with foreground schedules, or extended foreground schedules described herein.

For folding from an X1 die layer to an X2 die layer in the example eX2 die of FIG. 12, selection of a new fold source block may be the least recently programmed data block. In one implementation, the data in the selected fold source block must be of a type compatible with the current schedule. Also, a block containing zero valid data is permitted as the selected fold source block. In this case, the block is immediately added to the free block list. Another fold source block need not be selected until the next schedule cycle. Also, a selected fold source block remains the only folding source in the X1 die layer until all pages of valid data have been copied from it. An open fold source block may remain dormant if folding from the X1 die layer is not required in a current schedule. Valid data may be folded from an X1 fold source block in physical page address order, irrespective of the LBAs of the data being relocated, to a random update block in the X2 die layer. Folding is performed by means of copy operations via RAM 1218 in one embodiment With respect to source block selection in an eX3 die such as illustrated in FIG. 13, folding of data from X1 to X3 is accomplished by means of an on-chip copy rather than via RAM as discussed above for the eX2 die. The eX3 fold operation from X1 to X3 using on-chip copy operations must continue with the same type of data until an X3 fold destination block is completely filled, before a fold source block containing a different type of data may be selected. Data types referred to in this embodiment include sequential host data; any combination of random host data, frequent host data, or data from the X1 relocation destination block; data from the fold transit block; data from the X3 relocation destination block; and data from the X3 extended relocation destination block.

The X1 fold source blocks in an eX3 die may be selected serially until the X3 fold destination block becomes filled. When an X3 fold destination block becomes filled, selection of a new X1 fold source block of any of the above-noted data types can be made immediately. When a new X1 fold source block is required, the least recently programmed block containing the required data type is selected. However, in one implementation a block may be selected as a fold source block only if sufficient valid data of the same type exists in the X1 die layer to fill the X3 fold destination block currently in use. A selected fold source block remains the only folding source in the X1 die layer, until all pages have been copied from it, or the X3 fold destination block has become filled.

Selection of a fold destination block is made by the data management module 112 when a previous destination fold block has become full. A block from the head of the free block list for the destination die layer may then be selected. In one embodiment, the selected fold destination block remains the only fold destination block in that die layer until it becomes full. An open fold destination block may remain dormant if folding from the X1 die layer is not needed in the current schedule.

For the eX2 die, valid data may be folded from an X1 fold source block in physical page address order, irrespective of the LBAs of the data being relocated, to a random update block in the X2 die layer. Folding in an eX2 die may be performed by means of copy operations via RAM 1218. Similarly, for the eX3 die of FIG. 13, data may be folded from a fold source block in X1 in physical page address order, irrespective of the LBAs of the data being relocated, to the fold destination block in the X3 die layer. In contrast to the eX2 die embodiment of FIG. 12, folding in the eX3 die 1300 may be performed by means of on-chip copy operations rather than copy operations via RAM.

In one embodiment of a folding operation, all pages in the fold source block are folded, irrespective of how much obsolete data they may contain and the unit of data copy during folding may be defined by an individual copy transaction relating to a single die-page. Also, there is a balancing of free space during folding. The data management module 112 executes any folding operations in a schedule cycle so that free space existing in the X1 die layer at the start and at the end of folding from one fold source block remains unchanged, if foreground maintenance is active. The import of new data to a die layer is interleaved with folding from the X1 die layer to an X2 or X3 die layer in such a way as to balance the consumption and creation of free space within the die layer. For each die-page of data that is imported to the X1 die layer from a host, one die-page of data is preferably folded from the die layer.

Interleave Cycles

The concept of interleave cycles and different types of interleave cycles clustered into interleave groups is shown in FIG. 15. FIG. 15 shows a sample schedule cycle 1502 representing the total amount of data that will be written for the schedule cycle. A number of interleave cycles 1506 are grouped into interleave groups 1504, where each interleave group may have only one type of interleave cycle 1506 that is executed serially until all the interleave cycles for that interleave group are finished. Each interleave cycle 1506 may, in one embodiment, be defined to be as short as possible, to achieve maximum responsiveness to host commands. To accomplish this, the program interleave module 730 of the data management module 112 may calculate the interleave cycle to contain one instance of the least frequently occurring type of program operation in the schedule cycle 1502. This is normally, but not always, an operation for a host data write transaction. When a whole number of the interleave cycle will not evenly handle all of the host and maintenance data operations needed for the selected schedule type, then interleave cycles 1506 for host write and maintenance operations that differ in the relative numbers of pages programmed for each of the relevant data types are generated and grouped. The example of FIG. 15 shows 'N' possible interleave groups. Each particular schedule cycle 1502 and its particular combination of valid data in the selected source block for the applicable schedule type, and the amount of host data that will be permitted based on the source block, may lead to a need for anywhere from 1 to N different interleave groups 1504 to provide a whole number of pages of different data types for each interleave cycle 1506.

One example of an interleaving calculation table 1600 that may be determined by the program interleave module 730 for a selected schedule cycle is shown in FIG. 16. The example in FIG. 16 assumes an eX3 die such as in FIG. 13, where the data management module 112 has received host data, selected an available die, determined that an S5 schedule type for the eX3 die is needed and selected a source block in the X3 layer having 203 pages of valid data in an X3 block type with 252 user data pages possible. As noted previously, the maximum amount of host data permitted during a schedule is then the difference between the full block size for a block in the layer and the amount of valid data in the selected source block in that layer. In this instance the maximum amount of host data is 252−203=49 pages. Per the selected eX3 S5 schedule type (Table 3), the movement of 203 pages of data from the selected X3 block 1328 to the X3 relocation destination block 1316 along the X3 R data path is interleaved with both the 49 pages of host data to be written to X1 and the folding from a fold transit block 1314 of 252 pages (a complete block of user data in this example) into the fold destination block 1330 along data path F. Consumption and freeing of blocks is balanced in each layer (X1 and X3) at the conclusion of the S5 maintenance schedule.

As seen in the example of FIG. 16, the number of pages programmed per page of host data, assuming a single interleave cycle type for all host page writes (49 pages), relocation (203 pages) and fold (252 pages) writes, would not be a whole number and thus multiple different interleave cycle types are calculated and then grouped in interleave groups in such numbers as to provide a whole number of interleave cycles in each interleave group. In this example, the lowest number of interleave cycle types that can be aggregated to provide whole number ratios of page writes is two. Thus, interleave cycle type a and type b are generated.

The result is generating, for the entire schedule, interleave group A having 42 interleave cycles of type a and interleave group B having 7 interleave cycles of type b. The group A interleave cycles may all be executed in series followed by the group B interleave cycles.

The interleaving of host writes and maintenance operations depends on a given schedule identified as appropriate for a selected die, such as illustrated in the example schedule types in Tables 1 and 3. For those schedule types that do require both host write and maintenance operations, the specific calculation of an interleave cycle type or a plurality of interleave cycle types broken into different interleave groups, depends on the amount of valid data in the selected source block for the maintenance operation that is in the destination layer for the host data. An example of one of the predetermined schedule types for an eX3 die has been disclosed above. Each other of the predetermined schedule types that require maintenance operations in the example eX3 die will include the interleaving of host data and maintenance operations in the one or more die layers identified for maintenance operations in the particular schedule type.

Figure 17:
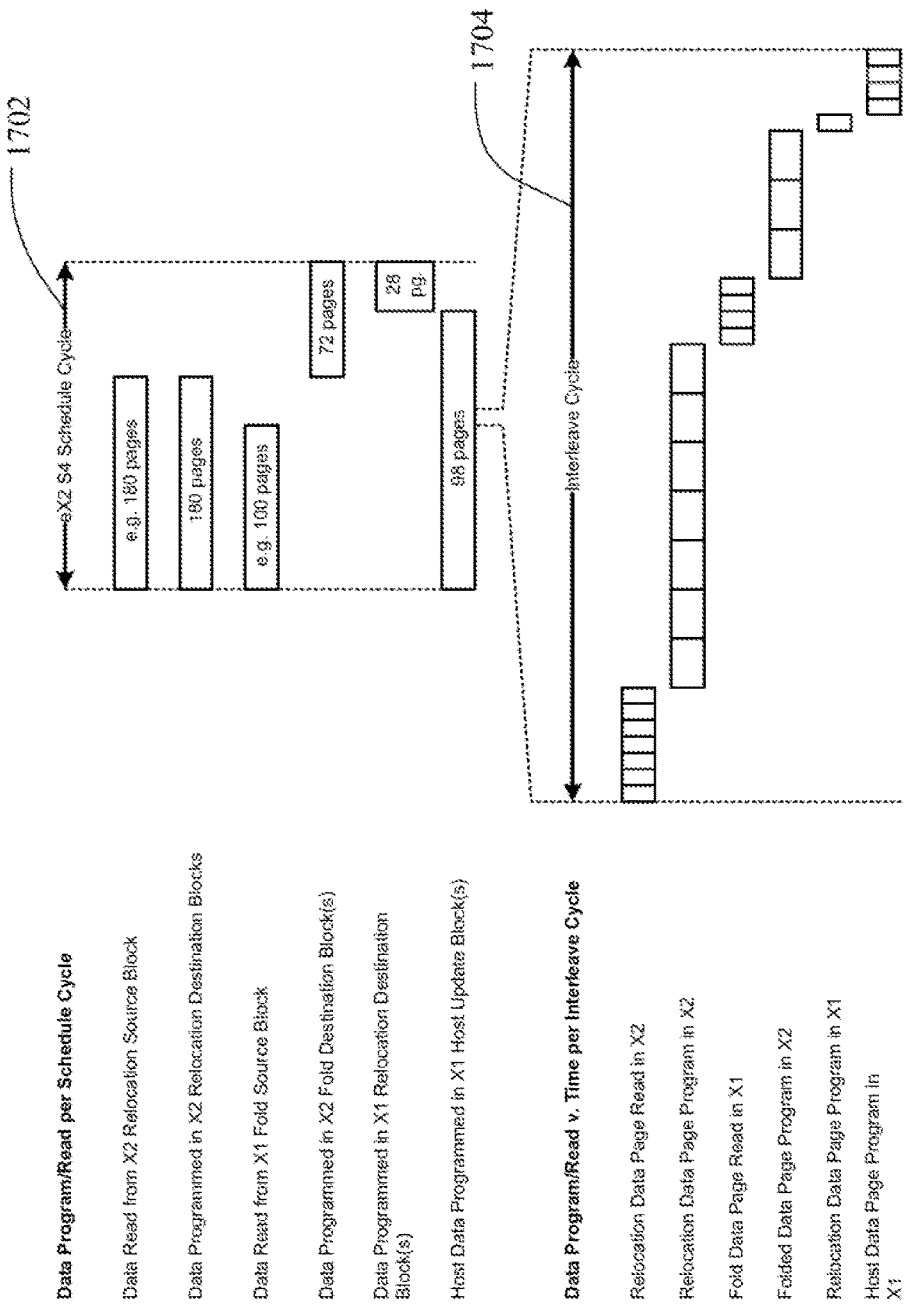
FIG. 17 is a chart of an alternative schedule cycle and interleave cycle determined according to the process of FIG. 14.

Similarly, for other non-volatile memory die configurations, such as the eX2 die of FIG. 12, interleave ratios are calculated for each schedule cycle after identifying the appropriate die and die layer, identifying the status of the selected die and die layers, selecting one of the predetermined schedule types based on the status of the selected die and then selecting a source block for maintenance operations in the selected die. One example of the interleave ratio determined for an eX2 die is shown in FIG. 17. In this example, it is assumed that an eX2 S4 schedule cycle type 1702 has been determined (from the predetermined plurality of types in Table 1) based on the host data type, the status (using the criteria of Table 2) of the selected die and the amount of valid data that needs to be moved to free the selected source block in the die. Also, the example of FIG. 17 assumes an eX2 die having an X1 die layer with 126 pages of user data per block (not including 2 parity pages per block) and an X2 die layer of 252 pages of user data per block (not including 4 parity pages per block). In this example of the eX2 S4 schedule cycle schedule type, the selected source block in the X2 layer has 180 pages of valid data to be moved into one or more relocation destination blocks in the X2 die layer using the X2 R data path (FIG. 12).

The selected X1 die layer source block for the fold of data from an X1 fold source block to an X2 die layer X2 fold destination block or relocation to an X1 relocation destination block has 100 pages of valid data. In this example, only 72 of the 100 pages in the X1 source block are folded to the X2 fold destination block, while 28 pages are relocated in the X1 die layer. This is because relocated X2 data of 180 pages leaves only 72 pages of space left (252−180=72) so that only a single block's worth of X2 capacity is consumed to balance the single X2 block freed by X2 relocation of the 180 pages. Thus, to free an X1 block as well in this schedule cycle, 100 pages of X1 data is moved from the source X1 block—72 pages folded along data path F to the X2 die layer and the remaining 28 pages to an X1 relocation block. Accordingly, the amount of X1 block capacity remaining for host data in this schedule cycle is X1 block capacity— relocated data in X1, or 126 pages−28 pages, leaving a maximum acceptable amount of host data at 98 pages (126−28=98).

The lowest number of operations for any data type in this schedule cycle would then be the programming of X1 relocation data (e.g. 28 pages) so one or more interleave cycle types are created so that whole numbers of pages of each data type (e.g. host data write, X2 relocation, X1 to X2 fold and so on) are included in each interleave cycle of this schedule cycle. In this example, the number of X1 to X2 fold pages (72) is not evenly divisible by the number of X1 relocation relocations (28), so more than one interleave type would be generated by the program interleave module 730 of the data management module 112 and interleave groups of the interleave cycle types would be executed. One interleave cycle type 1704 is shown in FIG. 17 for this eX2 S4 schedule cycle example. Using the lowest page count activity (here X1 relocation pages), one interleave cycle of a first interleave cycle type for this scenario may include programming 1 page of relocation in X1, 4 pages of host data to X1, 3 pages of data folded from X1 to X2, 7 pages of X2 data relocated to an X2 relocation block, in addition to the corresponding read operations of reading 7 pages of X2 data for relocation and reading 4 pages of X1 data for splitting between folding to X2 and relocating in X1. This particular interleave cycle type 1704 would be repeated, followed by an interleave cycle type having slightly different ratios of the write and read data, until all the data for the schedule cycle 1702 are complete.

Extended Maintenance Scheduling

In addition to the foreground maintenance procedures that are divided into the various schedule types of interleaved host write operation and maintenance operations discussed above, extended maintenance operations are contemplated. An extended maintenance operation is defined herein as a maintenance operation initiated for wear leveling, read scrub or defragmentation reasons that is performed concurrently with a series of foreground maintenance operations such as those described above. Thus, in an extended foreground maintenance operation a single "extended" maintenance operation is performed on an extended maintenance operation source block. The number of foreground schedule cycles in an extended maintenance cycle may be fixed or adaptive.

As one example of a memory system 100 where a fixed ratio of regular foreground maintenance cycles to extended maintenance cycles is used, consider a wear leveling algorithm executed by the controller that dictates one wear leveling operation for every 16 blocks of host data that is written. If it is assumed that the amount of obsolete data in a block is typically 25%, then the fixed amount of foreground maintenance schedule cycles per extended maintenance cycle may be 64. Thus, the extended maintenance cycle would spread out the wear leveling maintenance operation over 64 foreground maintenance schedule cycles in this example. A wear leveling operation need not start after exactly 16 blocks had been written. The example number of foreground maintenance schedule cycles over which an extended maintenance cycle takes place may be other fixed amounts for different memory systems or for different types of extended maintenance operations (e.g. wear leveling vs. read scrub) in the same memory system. Alternatively, the number of foreground maintenance schedule cycles over which an extended maintenance cycle is executed may be adaptive rather than fixed in other embodiments.

Figure 18A:
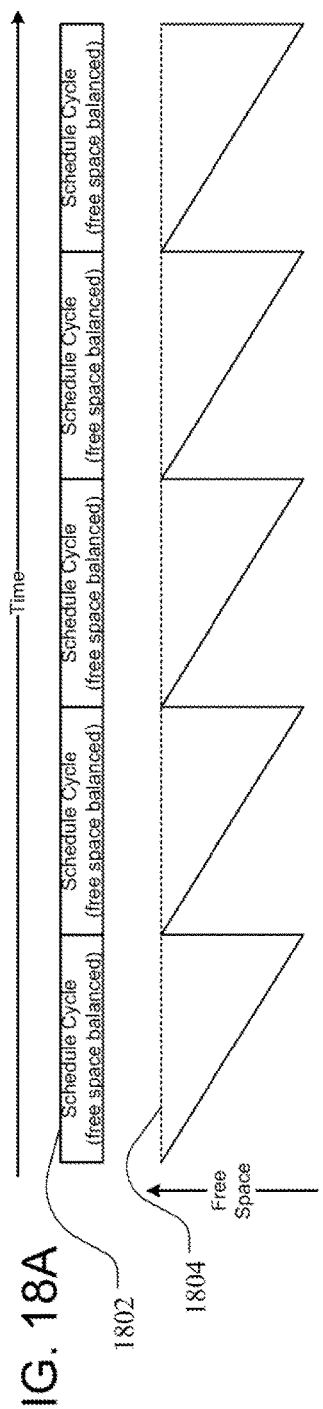
FIGS. 18A-18C illustrate an example free space creation and consumption charts for individual schedule cycles, extended schedule cycles and a composite of schedule cycles and an extended schedule cycle.

FIG. 18A illustrates an example of the difference between a series of individual maintenance schedule cycles 1802 as described above, where during a schedule cycle in a die layer, there is a balance of one block of data that is programmed for each block of free space that is created. As is illustrated, free space in a die layer is consumed by each page programming operation within the die layer for data from any source and the free space in a die layer decreases during the course of a schedule cycle. When the amount of free space is at the free space trigger threshold 1804 for initiating foreground maintenance schedule cycles, then a balance of consumption and freeing of a block of free space each cycle may be maintained as illustrated. At the end of each cycle 1802, the free space is created when the current maintenance source block, from which all valid data has now been moved, is erased.

Figure 18B:
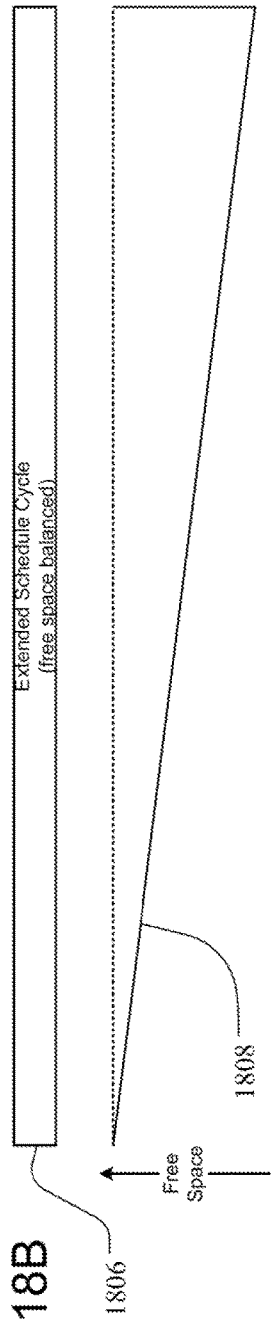
Figure 18C:
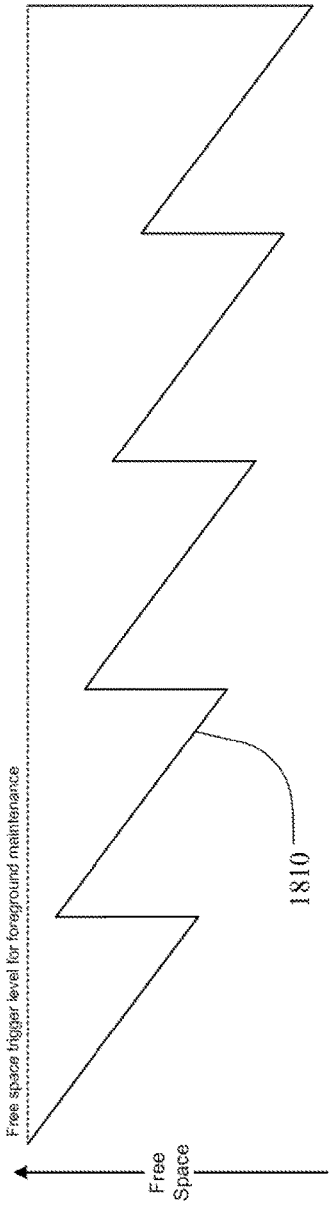

FIG. 18B illustrates, in comparison to FIG. 18A which has the same time scale as FIG. 18B, that when an extended maintenance cycle 1806 is initiated, the time over which a specially selected extended maintenance source block is freed covers several regular foreground schedule cycles. Extended foreground maintenance is a form of foreground maintenance in which a single extended maintenance operation is performed concurrently with a series of normal foreground maintenance schedule cycles 1802 such as described above. Extended maintenance is used to execute a special maintenance operation on a block, such as wear-leveling, read scrub and defragmentation, which may be unrelated to the free space or valid data thresholds of the regular foreground maintenance schedule cycles. The principle of freeing one block and consuming one block in each foreground maintenance schedule cycle is also followed in each extended maintenance schedule cycle as shown by the free space profile 1808 which, over the majority of the duration of the extended schedule cycle 1806 shows a decrease in free space until the end of the extended cycle when the extended cycle source block is freed. An example composite free space profile 1810 of the extended maintenance schedule cycle and the multiple foreground maintenance schedule cycles 1802 that the extended cycle concurrently executes with is shown in FIG. 18C. The example composite free space profile 1810 shows the jumps in free space that occur at the end of each cycle 1802, but that do not balance with the consumption of free space until the end of the concurrent extended maintenance cycle.

In an extended maintenance operation, all valid data in one extended relocation source block is relocated to one or more relocation destination blocks or extended relocation destination blocks. Page read and program operations to implement an extended maintenance operation are distributed as evenly as possible amongst the constituent foreground schedule cycles. An extended schedule cycle relocates data from a source block which is defined by an algorithm managing special maintenance operations. Any of a number of known wear-leveling, read scrub or defragmentation algorithms may be implemented for selecting the maintenance operation source block for an extended maintenance cycle. The algorithm managing special maintenance operations may select a source block for the extended maintenance schedule source block based on criteria associated with the special maintenance operation. For example if the special maintenance operation is for wear leveling, the source block may be the closed block in the appropriate die layer that has experienced a predetermined number of program/erase cycles.

An extended schedule cycle may relocate data to a relocation destination block, or extended relocation destination block, which is within the same die layer as the update block to which host data is being written. Also, two extended schedule cycles may exist concurrently, in the case where writing of host data is interleaved in any manner between two die layers. An extended schedule cycle may be temporarily suspended if host data is not currently being written to the die layer in which extended relocation is occurring.

Different extended maintenance data paths are available depending on the type of die involved, for example the eX2 or eX3 type dies illustrated in FIGS. 12-13. For an eX2 die such as shown in FIG. 12, the extended maintenance may be a relocation within the X1 die layer 1202, or a relocation within the X2 die layer 1204, referred to as ESX1 and ESX2 extended maintenance schedule cycles, respectively. For the ESX1 cycle, both the source block and destination block 1206 for the extended maintenance operation are located in the X1 die layer 1202 and the relocation uses the X1 R data path. For the ESX2 cycle, both the source block and destination block for the extended maintenance operation are located in the X2 die layer and the relocation uses the X2 ER data path, where the relocated data may be directed to the extended relocation destination block 1212.

Figure 19:
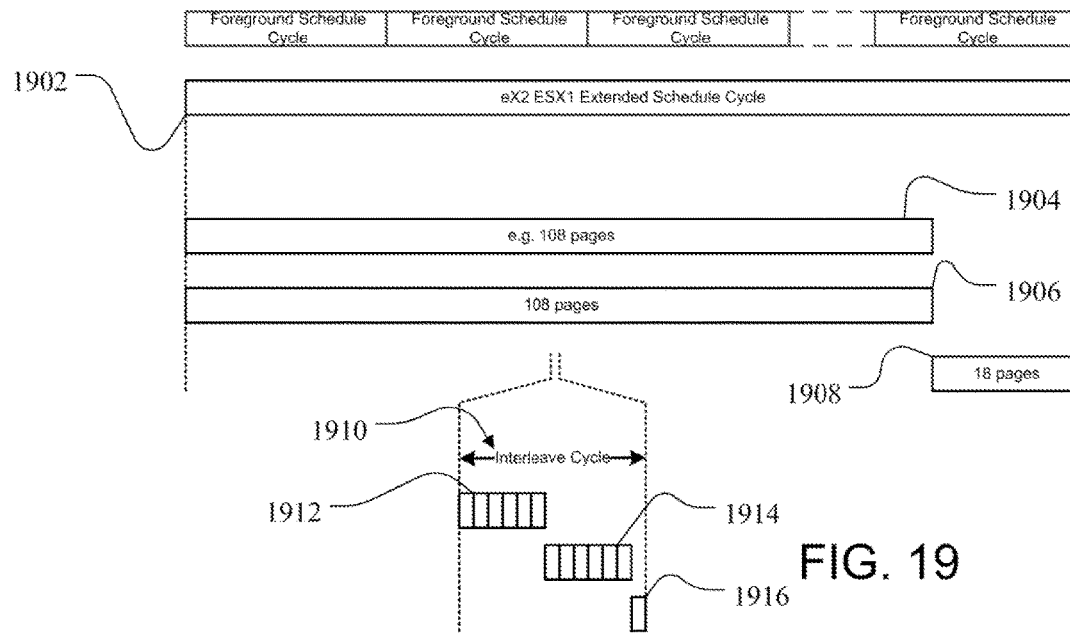
FIG. 19 illustrates an example extended maintenance schedule and associated interleave cycle in a one bit per cell die layer of a non-volatile memory die having one bit per cell and two bit per cell die layers.

Referring to FIG. 19, for an eX2 die, an ESX1 schedule cycle 1902 may operate concurrently with foreground schedule cycles 1904 in which host data is written to the X1 die layer. The ESX1 extended schedule 1902 spans multiple foreground schedule cycles, but operates on similar principles as the foreground schedule cycles in that an extended maintenance source block is selected that dictates a maximum amount of host data that may be programmed in the extended cycle, and that the extended maintenance cycle length is defined by the freeing of the selected source block by the end of the (extended) cycle rather than by any particular amount of host data that is programmed. As shown in FIG. 19 an extended relocation source block is selected from X1. The valid data from that source block is read 1904 from X1, that data is programmed to the extended relocation destination block or blocks 1906, and an amount of host data 1908 equal to the difference between an X1 block capacity (126 pages in this example) and the amount of valid data from the source block (108 pages in this example) is identified for programming. Thus, up to 126–108=18 pages of host data may be written during this ESX1 cycle 1902. Also, one or more interleave cycle types of interleave cycles 1910 (showing data program/read versus time per interleave cycle) are determined for the ESX1 cycle in the same manner as described for the non-extended schedules above. Here, the lowest amount of data in the cycle will be the host data (18 pages) and because that number divides evenly into the valid data to be relocated (108 pages), 18 interleave cycles 1910 of 6 pages each of relocation data reads 1912 and writes 1914 to 1 page of host data writes 1916 to X1 may be determined and executed.

Figure 20:
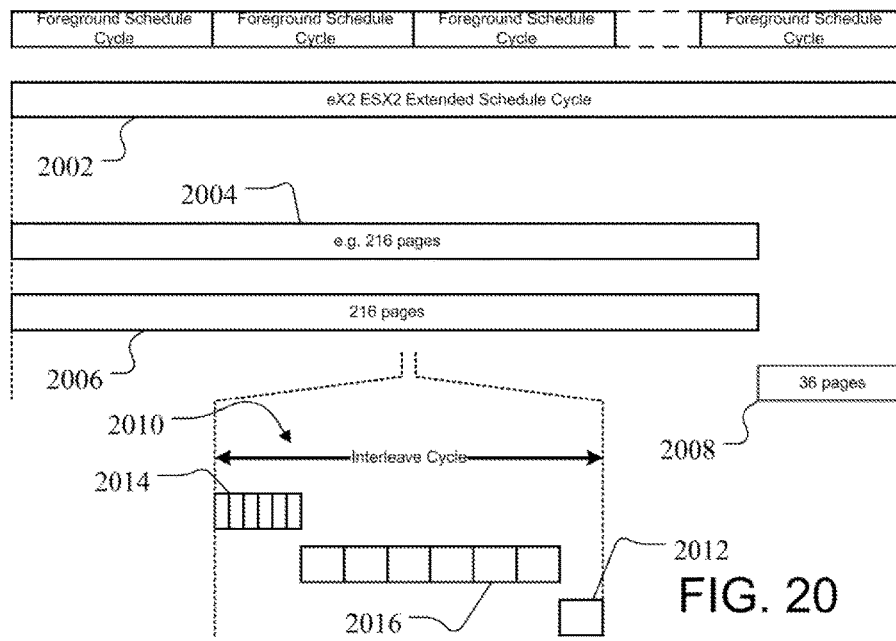
FIG. 20 illustrates an example extended maintenance schedule and associated interleave cycle in a two bit per cell die layer of a non-volatile memory die having one bit per cell and two bit per cell die layers.

Similar to the eX2 ESX1 schedule cycle, as shown in FIG. 20 an ESX2 schedule cycle 2002 may operate concurrently with foreground schedule cycles in which host data is written to the X2 die layer. Here, assuming a 252 X2 block size and an extended relocation source block of 216 valid pages to be read 2004 and relocated 2006, 252−216=36 pages of host data 2008 may be programmed in the ESX2 extended maintenance cycle 2002. The interleave cycles 2010 in this example may consist of a single interleave cycle type of 1 host write 2012 and 6 pages each of reads 2014 and writes 2016 of the X2 relocation data that is repeated 36 times to free the particular X2 extended relocation source block and complete the ESX2 cycle 2002.

For an eX3 non-volatile memory die 1300 configured as in the example of FIG. 13, two extended maintenance cycles are contemplated, ESX1 and ESX3. Available data flow paths in an eX3 die when an extended maintenance operation is active are shown in FIG. 13. For the ESX1 cycle in an eX3 non-volatile memory die, the data is sourced and relocated in the X1 die layer over the X1 R data path to the X1 relocation destination block. Data relocated from an extended relocation source block in the X1 die layer is programmed to the same relocation destination block in X1 as other relocated data. The eX3 ESX1 cycle is similar to the eX2 ESX1 cycle discussed above with respect to FIG. 19.

Figure 21:
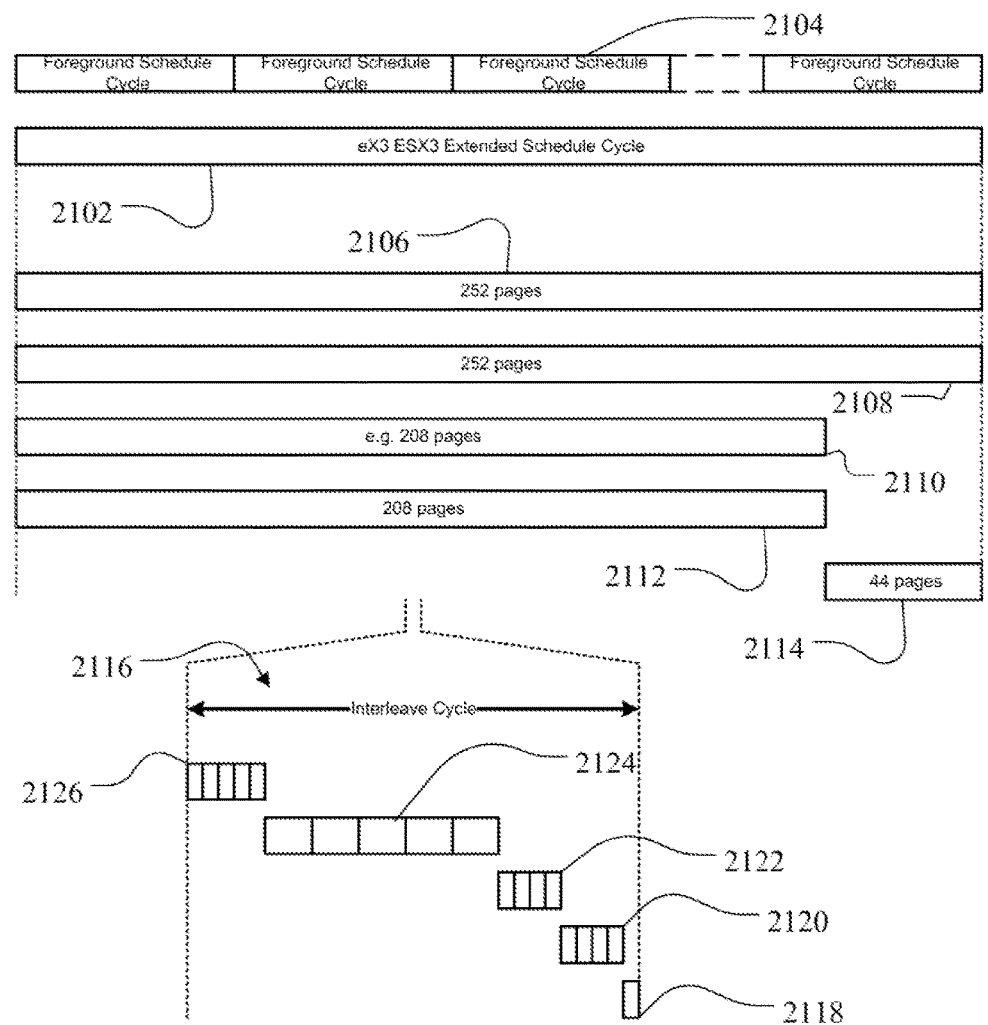
FIG. 21 illustrates and example extended maintenance schedule and associated interleave cycle in a three bit per cell die layer of a non-volatile memory die having one bit per cell and three bit per cell die layers.

Data relocated from an extended relocation source block 1328 in the X3 die layer 1302 is programmed in a dedicated relocation destination block in X1. More specifically, the ESX3 cycle may use the X3 ER data path where X3 data from a selected source block 1328 in the X3 die layer 1304 is copied to the X3 extended relocation destination block 1318 in the X1 die layer 1302. An example of an ESX3 extended maintenance cycle 2102 is illustrated in FIG. 21. The ESX3 cycle 2102 spans multiple foreground schedule cycles 2104 and may include an on-chip copy (avoiding a copy to RAM via the controller) fold operation along data path F (FIG. 13) of three X1 fold source blocks to one X3 fold destination block. For this example, the X1 and X3 die layers of the eX3 die are assumed to have block capacities of 84 pages and 252 pages of user data, respectively. Three X1 fold source blocks are read 2106 from the X1 die layer and programmed 2108 into the X3 destination fold block in the X3 die layer. The source block selected in the X3 die layer for extended relocation in this example has 208 pages of valid data, which means that 252−208=44 pages of host data may be written during the ESX3 schedule. The 208 pages of valid data from the X3 source block are read 2110 from the source block and written 2112 to multiple X3 extended relocation destination blocks in the X1 layer, along with the 44 pages of host data being written 2114 to appropriate open blocks in X1 based on the received data type. Thus, the X3 relocation is handled in the X1 die layer and the 3 blocks of X1 freed by the folding of X1 data into the X3 die layer are consumed by the valid X3 relocation data from the X3 source block into X1 and the host data written into X1. As a result, there may be a balance of free space generated and consumed in the ESX3 extended maintenance cycle 2102.

The interleave cycles generated by the program interleave module 730 of the data management module 112 are represented by the example interleave cycle 2116. Starting from the least frequent data, here the 44 pages of host data, the interleave cycle of 1 page of host data 2118, 4 pages of extended relocation programming 2120 in X1, 4 pages of extended relocation data read 2122 from X3, 5 pages of X3 fold data written 2124 to the open X3 fold block, and 5 pages read 2126 from the fold data source block in X1

Figure 22:
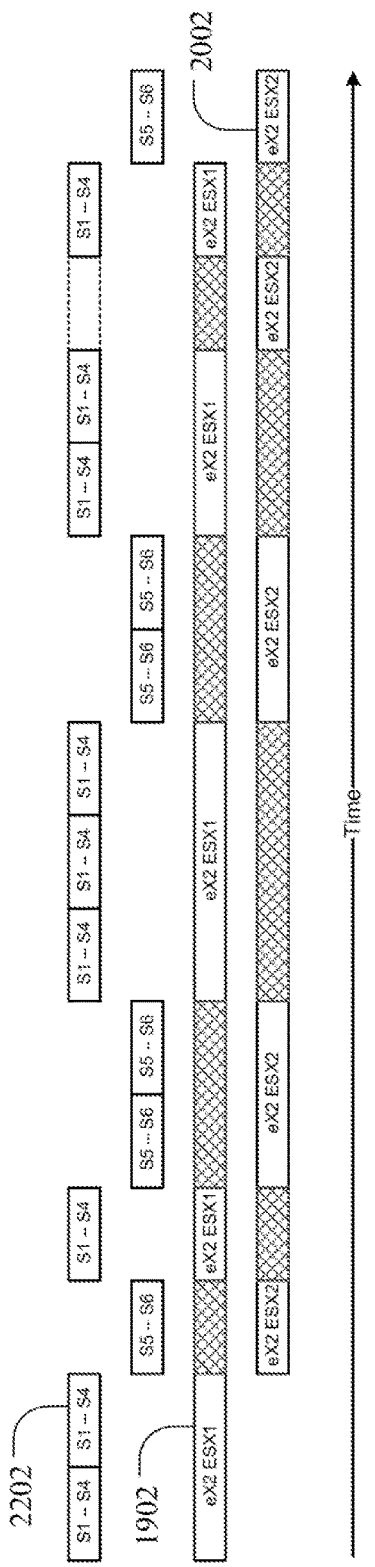
FIG. 22 illustrates an example timeline of foreground schedule cycles and concurrent extended maintenance cycles executing in an embodiment of a non-volatile memory die having both one and two bit per cell die layers.

FIG. 22 illustrates an example interleave schedule for concurrent foreground schedule cycles and extended maintenance schedule cycles in an eX2 die such as shown in FIG. 12. An individual interleave cycle comprises page program/read operations for either an ESX1 extended schedule cycle 1902 together with one or more S1-S4 foreground schedule cycles 2202 in the X1 die layer in any combination, or an ESX2 extended schedule cycle 2002 together with any combination of S5-S6 foreground schedule cycles in X2 as discussed above. Interleaving between ESX1 and ESX2 extended schedule cycles may have a minimum period of one interleave cycle in one embodiment. Note that FIG. 22 illustrates a special case where interleaving has a period of one foreground schedule cycle, for clarity. Two separate foreground schedule cycles can exist concurrently, to schedule individual host data write transactions to either the X1 die layer or the X2 die layer. Similarly, two separate extended maintenance schedule cycles can exist concurrently, each paired with a separate foreground schedule cycle.

Figure 23:
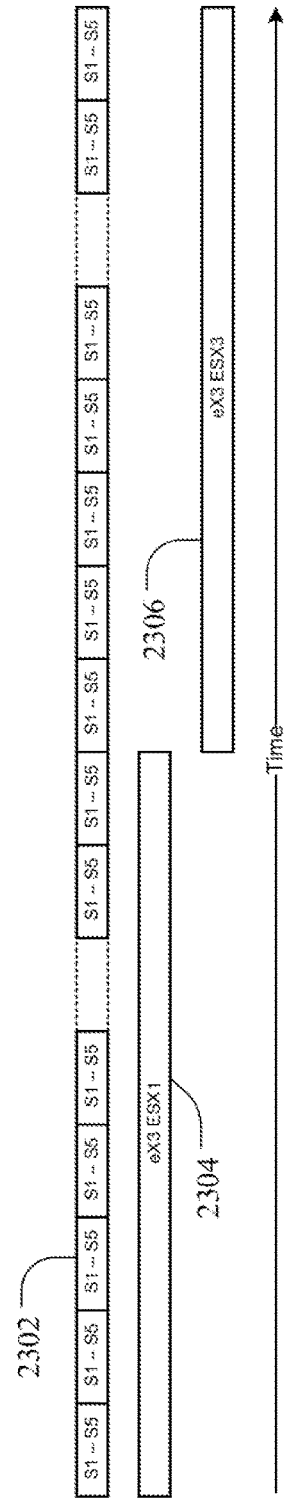
FIG. 23 illustrates an example timeline of foreground schedule cycles and concurrent extended maintenance cycles executing in an embodiment of a non-volatile memory die having both one and three bit per cell die layers.

FIG. 23 illustrates an example interleave schedule for concurrent foreground schedule cycles and extended maintenance schedule cycles in an eX3 die embodiment such as shown in FIG. 13. As shown, both ESX1 2304 and ESX3 2306 extended maintenance schedule cycles can operate concurrently with any foreground schedule cycle (S1-S5) 2302 because all host data in this embodiment of an eX3 die 1300 is written to the X1 die layer 1302.

Balanced Cycles of Maintenance Operations

Embodiments have been described above where, for a particular die layer of a particular die, source blocks may be selected and individual maintenance cycles may be selected from a predetermined set of maintenance cycle types. The systems and methods above may result in a net creation of free space that is balanced by a consumption of free space by host data write operations. Several techniques for interleaving maintenance writes, to move valid data from previously programmed blocks, with host data writes have been described. A free space generation and consumption balance may be managed individually for each operation to reclaim a maintenance source block. For example, a constant interleave ratio may be maintained throughout a particular maintenance block. Because the amount of valid data can vary considerably between selected maintenance source blocks, there may therefore be step changes in the write performance experienced by a host when the maintenance source block is changed.

One technique for reducing the potential for variations in the write performance that changing interleave ratios of separate maintenance cycles can cause is to balance the consumption of free space and creation of free space in a die layer over a longer period of operation defined herein as a balance cycle. A balance cycle incorporates relocating data from multiple maintenance source blocks, where one interleave ratio of maintenance writes and host data writes is calculated for all of the multiple maintenance source blocks selected for the balance cycle such that the variation in data write performance experienced by the host over the balance cycle may be less than the variation in the valid data content in the source maintenance blocks. Also, in a balance cycle, multiple scheduling points exist at which the interleave ratio between maintenance and host data programming may be re-scheduled.

Figure 24:
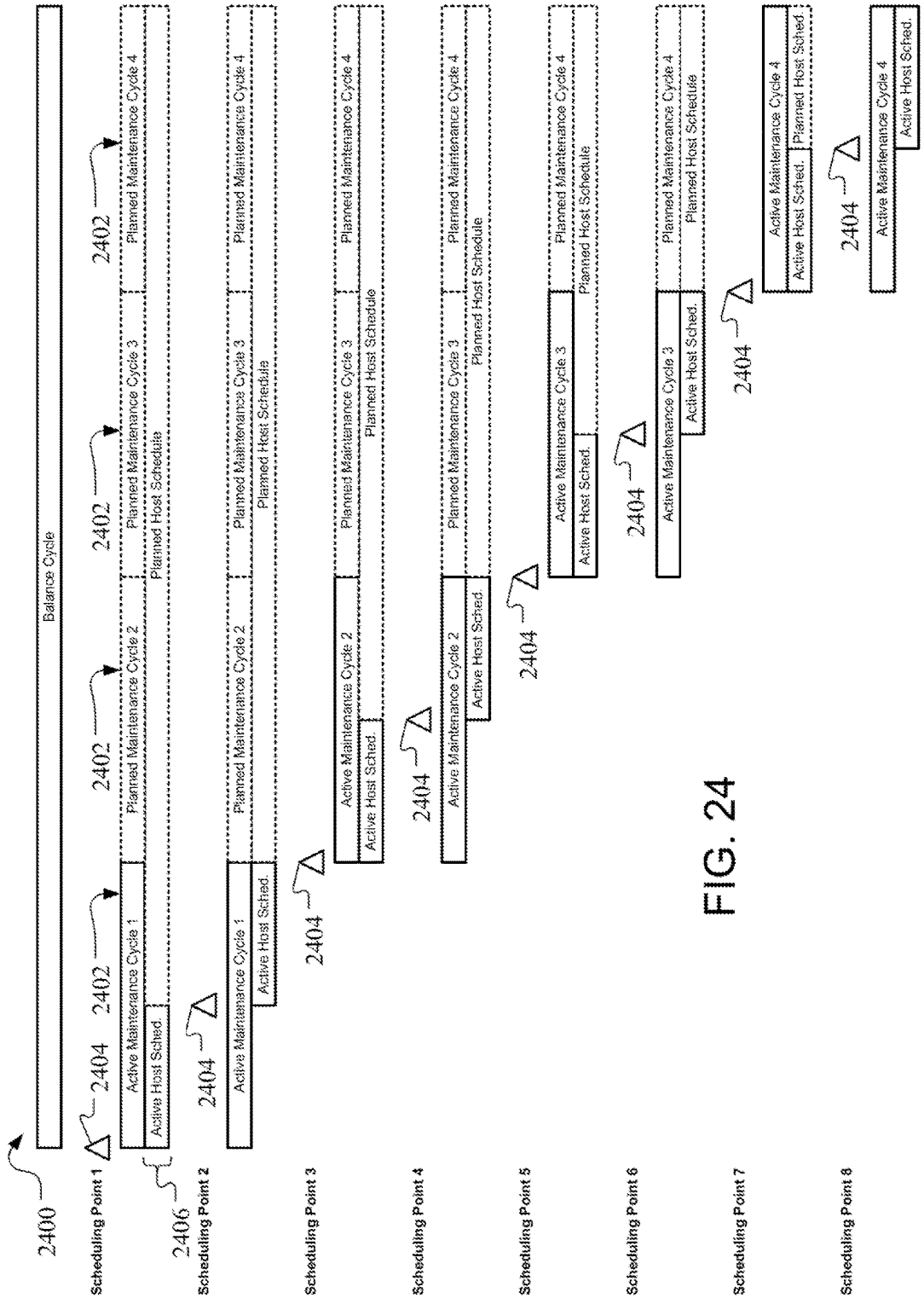
FIG. 24 illustrates on example of a balance cycle and the progression of scheduling points in each of a plurality of maintenance cycles in the balance cycle.

Referring to FIG. 24, a time progression of one sample balance cycle 2400 is illustrated. Each balance cycle includes an integer number of maintenance cycles 2402. The example balance cycle 2400 assumes four maintenance cycles 2402 per balance cycle, however other fixed numbers of maintenance cycles per balance cycle may be implemented. In yet other embodiments, the number of maintenance cycles per balance cycle may vary dynamically based on the occurrence of blocks containing a significantly higher or lower quantity of valid data than the remainder of the selected maintenance blocks in the balance set. In one implementation, a more uniform host performance may be maintained between successive balance cycles 2400 by including one or more such blocks in a balance cycle and extending the balance cycle than by including them in a standard length of balance cycle. As with the maintenance cycles defined previously, a maintenance cycle is the period over which all valid data is relocated from one maintenance source block.

Each balance cycle 2400 determined by the data management module 112 in the controller 102 includes scheduling points 2404, where a scheduling point is a point in time at which the schedule for interleaving programming operations for maintenance and host data is determined for the period until the next scheduling point 2404. Two scheduling points per maintenance cycle are illustrated in FIG. 24, however one or more scheduling points 2404 per maintenance cycle are contemplated in other implementations. A scheduling point may be placed at the start of maintenance on each maintenance source block, and then any additional scheduling points 2404 during a maintenance cycle 2402 on a source maintenance block may be placed based on a total number of writes (host and maintenance writes) that have taken place, a percentage of valid data moved from the particular maintenance source block or on other criteria. If no valid data in a current maintenance source block is being made obsolete by host data writes during a maintenance cycle 2402, there may be no advantage in having more than one scheduling point 2404 in the maintenance cycle. However, if valid data in the current maintenance source block is being made obsolete by the host during the maintenance cycle 2402, variation in host write performance over the course of the maintenance cycle reduces as the number of scheduling points in the maintenance cycle increases. This may be applied dynamically. Each time a scheduling point 2404 is calculated, the number of remaining scheduling points in the maintenance cycle 2402 can be increased by one if the obsoleted data exceeds a threshold amount. Similarly, if no data has been made obsolete in the previous scheduling point interval, the number of remaining scheduling points in the maintenance cycle can be reduced by one (but not to zero). The interval to the next scheduling point must be defined at each scheduling point, in one embodiment.

The scheduling points 2404 may be evenly spaced throughout each maintenance cycle 2402 that makes up the overall balance cycle 2400 and each maintenance cycle may have the same number of scheduling points as each other maintenance cycle in the balance cycle. In one implementation, each scheduling point 2404 may be set at a point in time where a predetermined number of maintenance writes in the currently active maintenance cycle have occurred. Alternatively, the scheduling points may be set at the point in time that a predetermined number of host writes in the currently active maintenance cycle have occurred. In yet other embodiments, the scheduling points 2404 may be set at the point in time that a predetermined number of host writes and maintenance writes in the currently active maintenance cycle have occurred.

As shown in FIG. 24, each maintenance cycle 2402 remaining in the balance cycle 2400 is designated as an active maintenance cycle or a planned maintenance cycle. An active maintenance cycle is the next maintenance cycle 2402 committed at a scheduling point 2404, while a planned maintenance cycle is a future maintenance cycle 2402 provisionally planned at a scheduling point 2404, which may be modified at any subsequent scheduling point 2404. Similarly, the host schedule 2406 of host writes to be interleaved during a maintenance cycle 2402 is designated as active or planned, where an active host schedule is the next interleave schedule for host writes committed at a scheduling point 2404 and a planned host schedule is the planned continuation of the active host schedule until the end of the balance cycle 2400. However, the host schedule 2406 may be modified at any subsequent scheduling point 2404.

As shown in the example balance cycle 2400 having four maintenance cycles 2402, at the first scheduling point 2404 (scheduling point 1) the active maintenance cycle is the one being started and the remaining maintenance cycles 2402 are referred to as planned maintenance cycles where the maintenance source block used for a planned maintenance cycle can be changed from an initially selected maintenance source block. As the balance cycle progresses, which in FIG. 24 is illustrated in the downward direction where time has passed and earlier portions of the maintenance cycles making up the balance cycle have been completed, the next scheduling point (scheduling points 2-8 in this example) marks the next re-evaluation of the interleave ratio for the balance cycle.

Figure 25:
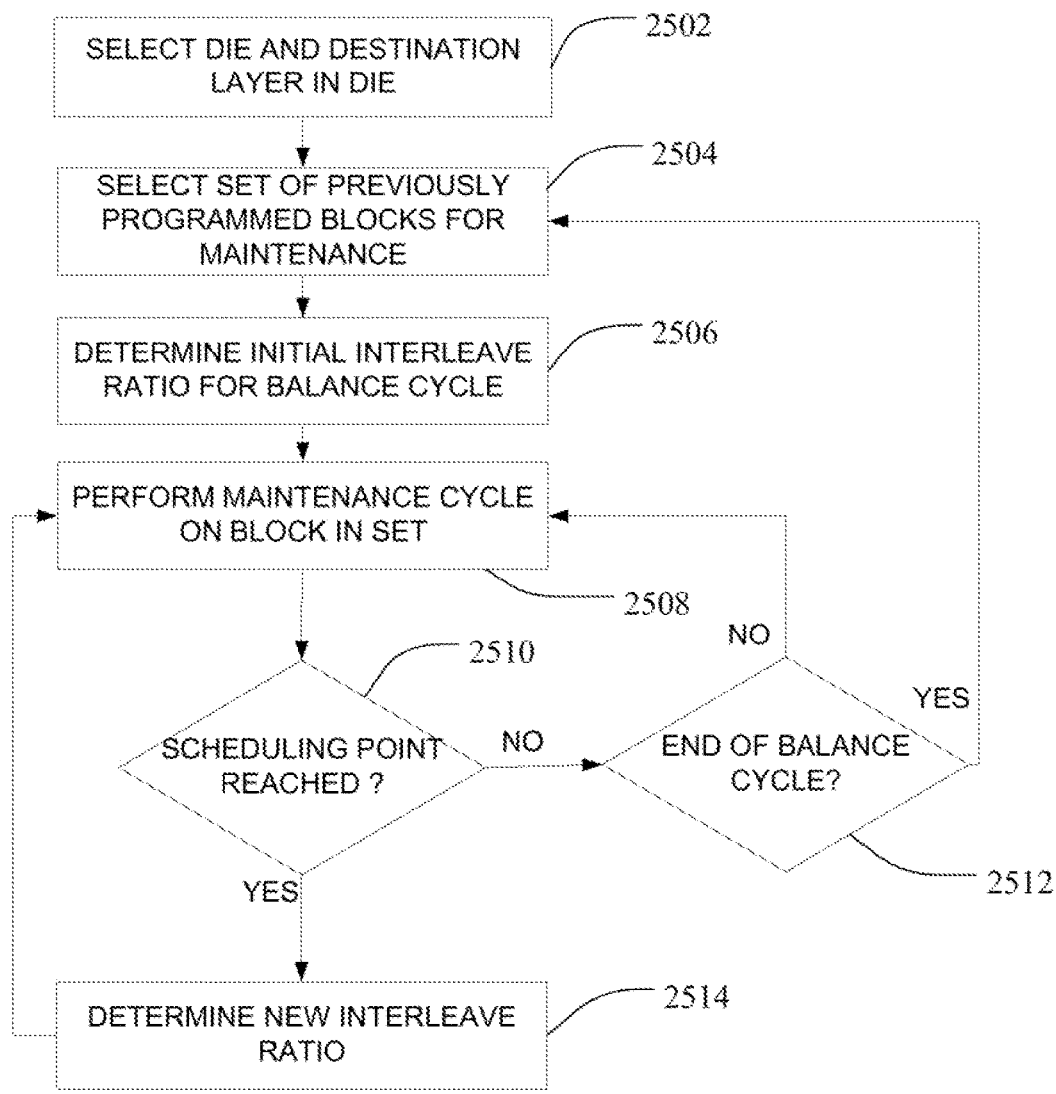
FIG. 25 is a flow diagram of an embodiment for generation and execution of a balance cycle of maintenance cycles, such as illustrated in FIG. 24, in a non-volatile memory system.

Referring now to FIG. 25, the data management module 112 associated with the controller 102 of a non-volatile memory system 100 may initiate a balance cycle of foreground maintenance cycles using the techniques described above for individual block maintenance cycles. The data management module 112 selects a die and destination layer in a die, and then selects a predetermined number of previously programmed blocks in the selected die and die layer for a balance cycle (at 2502, 2504). The initial interleave ratio of host writes to maintenance writes for the selected set of previously programmed blocks may be determined by the program interleaving module 730 of the data management module based on the total amount of valid data in the selected set (at 2506). The determined interleave ratio may be a fixed interleave ratio expected for the balance cycle, or, in the same manner as described in greater detail above for non-integer ratios in single block schedule cycles, may be a predetermined set of interleave ratios needed to achieve the overall calculated interleave ratio for the selected set of blocks in the balance cycle (at 2508).

Upon reaching a next scheduling point in the balance cycle, the interleave ratio is recalculated by the program interleaving module 730 for the remainder of the balance cycle based on the current amount of valid data in the remainder of the set of selected blocks (at 2510, 2514). Prior to an end of the balance cycle, which is defined by the period of time it takes to move all valid data from the predetermined number of source maintenance blocks selected for the balance cycle, and between scheduling points, the maintenance operation proceeds on a current selected one of the set of blocks, and using the last calculated balance cycle interleave ratio, until the next scheduling point is reached or the end of the balance cycle is achieved (at 2510, 2512). It should be noted that the step of determining a new interleave ratio (at 2514) may include the data management module 112, at the time a scheduling point has been reached, reviewing whether or not the remaining selected maintenance source blocks awaiting maintenance operations in the current balance cycle need to be swapped with other closed (previously programmed) blocks. As described in greater detail below, the particular maintenance source block selection algorithm used by the data management module will dictate whether blocks in the balance cycle will be swapped based on whether a maximum host data write performance is desired, a minimum host data write variation is desired, or some other host write performance metric is desired. The lineup of the current selected blocks for the current balance cycle may be examined and changed, in addition to a new interleave ratio being calculated based on that lineup change or other change in the amount of valid data in the current set of predetermined number of maintenance source blocks.

During a balance cycle 2400, the interleave ratio for the next active host schedule is determined at each scheduling point 2404. Because the amount of valid data in a set of maintenance source blocks does not necessarily remain static due to host activity during a balance cycle, maintenance source blocks are reevaluated for a next active and remaining planned maintenance cycles within the balance cycle and may change from the originally selected set of maintenance source blocks. Maintenance source blocks may be changed at the first scheduling point in a maintenance cycle, and planned maintenance source blocks (those forming part of the set of source maintenance blocks that have not had any maintenance operations yet applied) can be changed at any scheduling point 2404. To determine the interleave ratio, at each scheduling point, the total number of maintenance program operations (past, committed and planned) in the complete balance cycle is determined, on the basis of the valid data content in the currently selected maintenance source blocks. Also, the total number of permitted host data program operations within the complete balance cycle is determined, on the basis of balanced creation and consumption over the number of blocks programmed and erased in the balance cycle. At each scheduling point 2404 during a balance cycle 2400, a remaining number of host data program operations in the balance cycle is determined, on the basis of the number already completed and the number of host data program operations before the next scheduling point 2404 is determined, on the basis of the number of remaining scheduling points in the balance cycle.

A balance cycle 2400 involving multiple maintenance source blocks as described above may provide a way of smoothing responsiveness to a host, as compared to separate independent maintenance schedule cycles executed on individual maintenance source blocks. The smoothing of the responsiveness with a balance cycle is essentially achieved through averaging of an interleave ratio of host writes to maintenance writes over a predetermined number of maintenance source blocks selected for the balance operation. The initial evaluation at the beginning of a balance cycle 2400, and subsequent reevaluation at each subsequent scheduling point 2404 of a balance cycle, of interleave ratio and/or selection of maintenance source blocks, may depend on the selection algorithm utilized.

In one implementation, the data management module 112 generates each balance cycle 2400 separately and, after identifying the desired die and the die layer of that die, always selects maintenance source blocks from that die layer that have the least amount of valid data in them. Thus, closed blocks containing the least amount of valid data are selected at each scheduling point for the next active maintenance cycle and the remaining planned maintenance cycles. Using this first block selection algorithm, a balance cycle will consist of the least amount of data relocation and the greatest amount of host data writing. At each scheduling point of a balance cycle that uses this first block selection algorithm, blocks originally selected for planned maintenance cycles in a balance cycle may be switched out for other closed blocks in the selected die layer if those other closed blocks currently have less valid data than the originally selected blocks. In this first block selection algorithm, the selected maintenance source blocks are selected specifically for having the least amount of valid data without regard to any particular amount of valid data that may be in the set of maintenance source blocks selected for a subsequent balance cycle.

In another implementation, a second block selection algorithm may be used for selecting the maintenance source blocks at each scheduling point in a balance cycle. A goal of this second algorithm involves trying to have the maintenance manager of the data management module keep an even host response rather than achieve the fastest host response as in the first block selection algorithm. For the second block selection algorithm, the maintenance manager may be configured to select blocks that achieve a particular balance of maintenance writes to host writes and then, at each scheduling point 2404, reevaluate whether to swap selected blocks to keep the original balance of maintenance writes to host writes, rather than selecting maintenance source blocks with the lowest amount of valid data. Thus, in the second block selection algorithm, originally selected blocks that may have had more data become obsolete during the initial portion of the balance cycle, may be swapped out by the maintenance manager for a block with an amount of valid data needed to maintain the originally planned interleave ratio. A result of implementing the second block selection algorithm may be to both minimize variations of host write speeds between balance cycles, as well as to minimize variations in host write speeds during a balance cycle. In contrast, the first block selection algorithm discussed above, where blocks with the least amount of valid data are always selected, may maximize the amount of host data written in a balance cycle and reduce variations of host write performance during a balance cycle.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A method of managing data comprising:
performing, in a non-volatile memory system having a non-volatile memory with a plurality of layers and a controller in communication with the non-volatile memory, each of the plurality of layers having a different bit-per-cell data capacity, the following steps:
  only directing data received from a host to a first layer of the plurality of layers;
  only maintaining a single open block at a time in a second layer of the plurality of layers for receiving any data from the first layer;
  prior to programming the data received from the host into the first layer, determining whether a maintenance operation is necessary for both the first layer and the second layer; and
  in response to determining that the maintenance operation is necessary for both the first layer and the second layer,
    selecting a maintenance cycle type from a predetermined set of maintenance cycle types for the non-volatile memory based on a status of the first layer and the second layer; and
    when the selected maintenance cycle type includes instructions to transfer data from the first layer to the second layer and a relocation maintenance operation for relocating data from a source block into another block in the second layer:
      executing the selected maintenance cycle type by:
        transferring valid data from the first layer to the single open block in the second layer via a single data path, wherein the non-volatile memory system only assigns a new open block in the second layer for receiving data from the first layer after the single open block is fully programmed; and transferring valid data from a selected relocation source block in the second layer to at least one intermediate destination block in the first layer for subsequent copying back to the second layer via the single data path.

2. The method of claim 1, wherein determining that the maintenance operation is necessary comprises determining that an amount of free space in the first layer is less than a predetermined maintenance threshold.

3. The method of claim 2, wherein the status of the first layer comprises an amount of valid data in the first layer, and wherein selecting the maintenance cycle type comprises selecting a maintenance cycle type that includes instructions to transfer data from the first layer to the second layer when the amount of valid data in the first layer is greater than or equal to a data transfer threshold.

4. The method of claim 3, wherein the selected maintenance cycle type comprises a combination of instructions for programming data received from the host into the first layer and transferring data from at least one source block in the first layer to the single open block in the second layer.

5. The method of claim 4, further comprising determining an interleave ratio for interleaving the programming of data received from the host and transferring data from the at least one source block, prior to executing the selected maintenance cycle, based on an amount of valid data in the at least one source block.

6. The method of claim 1, wherein the first layer comprises a lower bit-per-cell-capacity than the second layer and wherein transferring valid data from the first layer to the single open block in the second layer comprises transferring the valid data from the first layer to the single open block via an on-chip copy process.

7. A memory system, comprising:
at least one non-volatile memory having a first layer and a second layer of non-volatile memory cells, wherein the first layer has only non-volatile memory cells configured at a first bit-per-cell capacity and the second layer has only non-volatile memory cells configured at a second bit-per-cell capacity that is greater than the first bit-per-cell capacity; and
data management circuitry in communication with the at least one non-volatile memory, wherein the data management circuitry comprises:
data flow path circuitry defining a plurality of predetermined data paths for programming data received from a host or maintenance operation data into the first layer, and defining only a single data path for programming any data into the second layer;
maintenance manager circuitry configured to:
select a foreground maintenance schedule to free space in at least one of the first and second layers based on a status of at least one of the first and second layers;
maintain no more than one open block at a time in the second layer for receiving data into the second layer; and
for a relocation maintenance operation in the second layer, copy valid data to at least one intermediate relocation block in the first layer before copying the valid data via the single data path into a current open block in the second layer;
and
program interleaving circuitry configured to interleave programming of data received from the host with maintenance operation writes for the foreground maintenance schedule selected by the maintenance manager circuitry along one or more data paths defined by the data flow path circuitry.

8. The memory system of claim 7, wherein the single data path for programming any data into the second layer comprises a data path between the first layer and the second layer.

9. The memory system of claim 8, wherein the single data path comprises an on-chip copy data path configured to copy data from the first layer to the second layer, wherein the data management circuitry is configured to only permit programming of data to the second layer via the single data path.

10. The memory system of claim 7, wherein the first layer comprises a plurality of open blocks of memory cells, each of the plurality of open blocks being configured to receive data of a different data type from the host.

11. The memory system of claim 10, wherein the first layer further comprises at least one open maintenance data block configured to only receive valid data relocated from a closed block in the first layer, and at least one open maintenance block configured to only receive valid data relocated from the second layer.

12. The memory system of claim 11, wherein the plurality of open blocks comprises a random host data update block and a sequential host data update block.

13. The memory system of claim 7, wherein the non-volatile memory comprises a silicon substrate and a plurality of memory cells forming a monolithic three-dimensional structure, wherein at least one portion of the memory cells is vertically disposed with respect to the silicon substrate.

14. The memory system of claim 7, wherein the at least one non-volatile memory comprises a plurality of non-volatile memory die, and wherein the data management circuitry is configured to first select an available non-volatile memory die for programming data received from the host prior to selecting the foreground maintenance schedule.

15. A memory system, comprising:
at least one non-volatile memory having a first layer and a second layer of non-volatile memory cells, wherein the first layer has only non-volatile memory cells configured at a first bit-per-cell capacity and the second layer has only non-volatile memory cells configured at a second bit-per-cell capacity that is greater than the first bit-per-cell capacity; and
controller means, in communication with the at least one non-volatile memory, for:
identifying a type of data received from a host and determine whether a maintenance operation is necessary in the first layer before programming the received data;
selecting a maintenance cycle type from a predetermined set of maintenance cycle types for the non-volatile memory based on a status of the first layer;
when the selected maintenance cycle type includes instructions to move data to the second layer, interleaving programming of an amount of the received data into the first layer with re-programming of valid data from a closed block in the first layer to the second layer;
maintaining only a single open block at any time in the second layer for receiving data into the second layer;
executing a relocation maintenance operation in the second layer by copying valid data from the second layer to at least one intermediate relocation block in the first layer before copying the valid data into a current open block in the second layer; and directing all data received from the host to the first layer and programming data into the open block in the second layer from the first layer only via an on-chip copy operation.

16. The memory system of claim 15, wherein the first layer comprises a one bit-per-cell capacity and the second layer comprises a three bit-per-cell capacity.

17. The memory system of claim 16, wherein the at least one non-volatile memory comprises a plurality of non-volatile memory die, and wherein the controller means is configured for first selecting an available non-volatile memory die for programming data received from the host prior to selecting the maintenance cycle type.

* * * * *